(12) United States Patent
Son et al.

(10) Patent No.: US 12,740,251 B2
(45) Date of Patent: Sep. 15, 2026

(54) DISPLAY APPARATUS WITH CONDUCTIVE BANK LAYER AND MANUFACTURING METHOD THEREOF

(71) Applicant: Samsung Display Co., Ltd., Yongin-si (KR)

(72) Inventors: Sewan Son, Yongin-si (KR); Sungho Kim, Yongin-si (KR); Jiseon Lee, Yongin-si (KR); Sugwoo Jung, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 337 days.

(21) Appl. No.: 18/519,128

(22) Filed: Nov. 27, 2023

(65) Prior Publication Data

US 2024/0179958 A1 May 30, 2024

(30) Foreign Application Priority Data

Nov. 30, 2022 (KR) ........................ 10-2022-0165101

(51) Int. Cl.
*H10K 59/122* (2023.01)
*H10K 59/12* (2023.01)
*H10K 59/80* (2023.01)

(52) U.S. Cl.
CPC ....... *H10K 59/122* (2023.02); *H10K 59/1201* (2023.02); *H10K 59/80521* (2023.02)

(58) Field of Classification Search
CPC ............. H10K 59/122; H10K 59/1201; H10K 59/80521
See application file for complete search history.

(56) References Cited

U.S. PATENT DOCUMENTS 8,334,545 B2 12/2012 Levermore et al.
9,577,209 B2 2/2017 Tanada et al.
(Continued)

FOREIGN PATENT DOCUMENTS

KR 10-2050505 11/2019
KR 10-2021-0046114 4/2021
KR 10-2021-0086869 7/2021

OTHER PUBLICATIONS

Guo et al., "A Review of Germanium-Antimony-Telluride Phase Change Materials for Non-Volatile Memories and Optical Modulators", Applied Science, Feb. 4, 2019, pp. 530 (1-26), vol. 9, No. 3.

*Primary Examiner* — Norman D Richards
*Assistant Examiner* — Sean Ayers Winters
(74) *Attorney, Agent, or Firm* — Harness, Dickey & Pierce, P.L.C.

(57) ABSTRACT

A display apparatus includes a first sub-pixel electrode, a conductive bank layer including a first opening overlapping the first sub-pixel electrode in a plan view, an insulating layer between a peripheral portion of the first sub-pixel electrode and the conductive bank layer, a first intermediate layer disposed on the first sub-pixel electrode in the first opening of the conductive bank layer, and a first counter electrode disposed on the first intermediate layer in the first opening of the conductive bank layer. The conductive bank layer comprises a first conductive layer, a second conductive layer on the first conductive layer, and a third conductive layer on the second conductive layer. The first counter electrode has a width greater than a width of the first intermediate layer. The first counter electrode is in direct contact with the conductive bank layer.

20 Claims, 22 Drawing Sheets

(56) References Cited

U.S. PATENT DOCUMENTS

| | | | | |
|---|---|---|---|---|
| 11,257,893 | B2 | 2/2022 | Kim et al. | |
| 11,489,023 | B2 | 11/2022 | Son et al. | |
| 11,563,074 | B2 | 1/2023 | Cho et al. | |
| 2014/0183479 | A1* | 7/2014 | Park | H10K 59/1315 438/34 |
| 2014/0183501 | A1* | 7/2014 | Kim | H10K 59/122 438/34 |
| 2015/0340413 | A1* | 11/2015 | Lee | H10K 59/80515 257/40 |
| 2016/0149156 | A1* | 5/2016 | Kim | H10K 59/121 438/46 |
| 2019/0165064 | A1* | 5/2019 | Lee | G09G 3/3258 |
| 2022/0302222 | A1 | 9/2022 | Lee et al. | |

* cited by examiner

OP1
OP2
OP3
CP T 330OP1
T
T 330OP2
T
T 330OP3
T
320OP1
310OP1
1220
1210
320OP2
310OP2
2220
2210
320OP3
310OP3
3220
3210
330
320
310
300
115
113
190
170
150
130
110
100
CM
CM
CM
T1
Cst PC1
T1
Cst PC2
162 120 T1 140 160 Cst PC3
DA
z

FIG. 3C

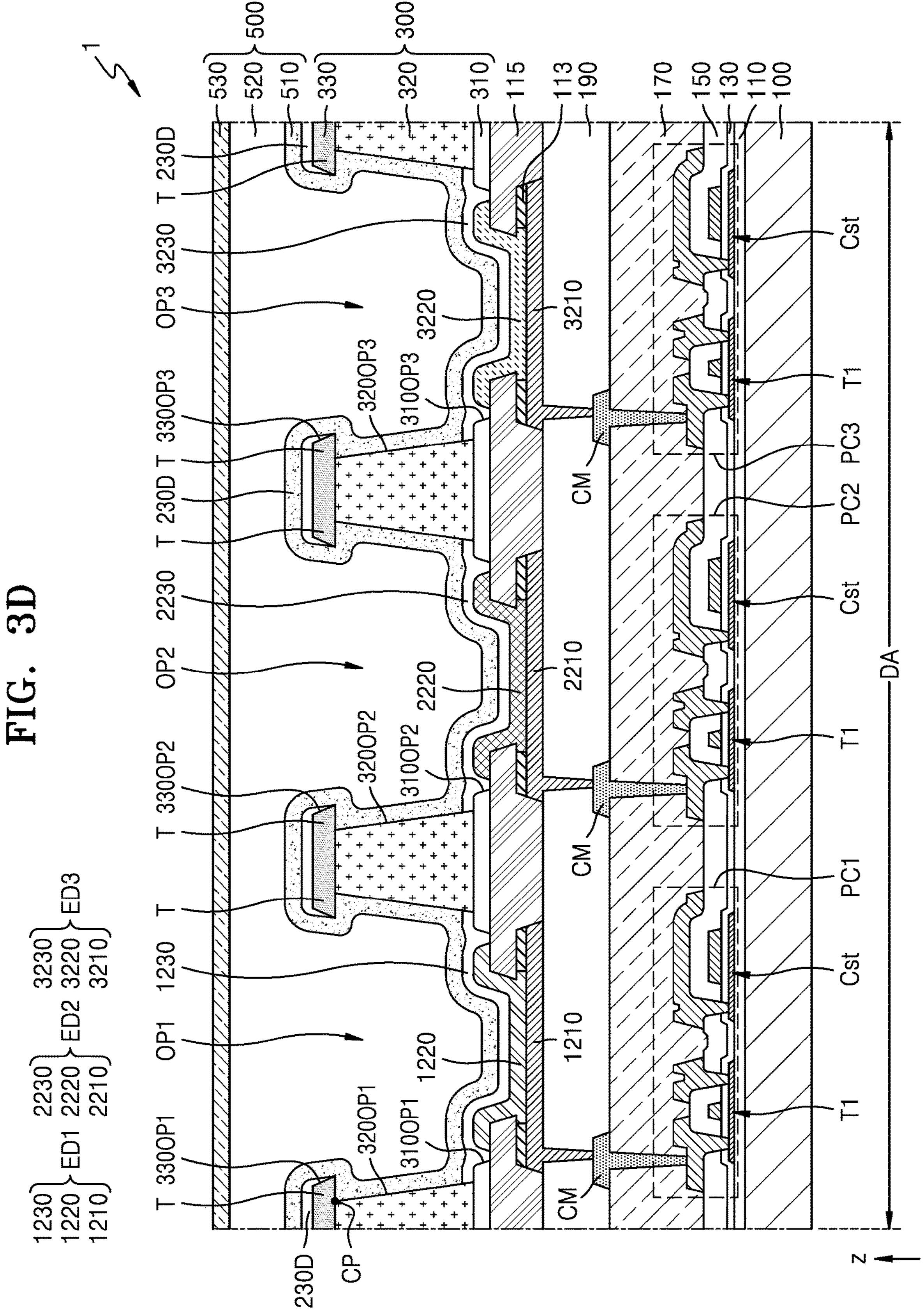

Figure 5D:
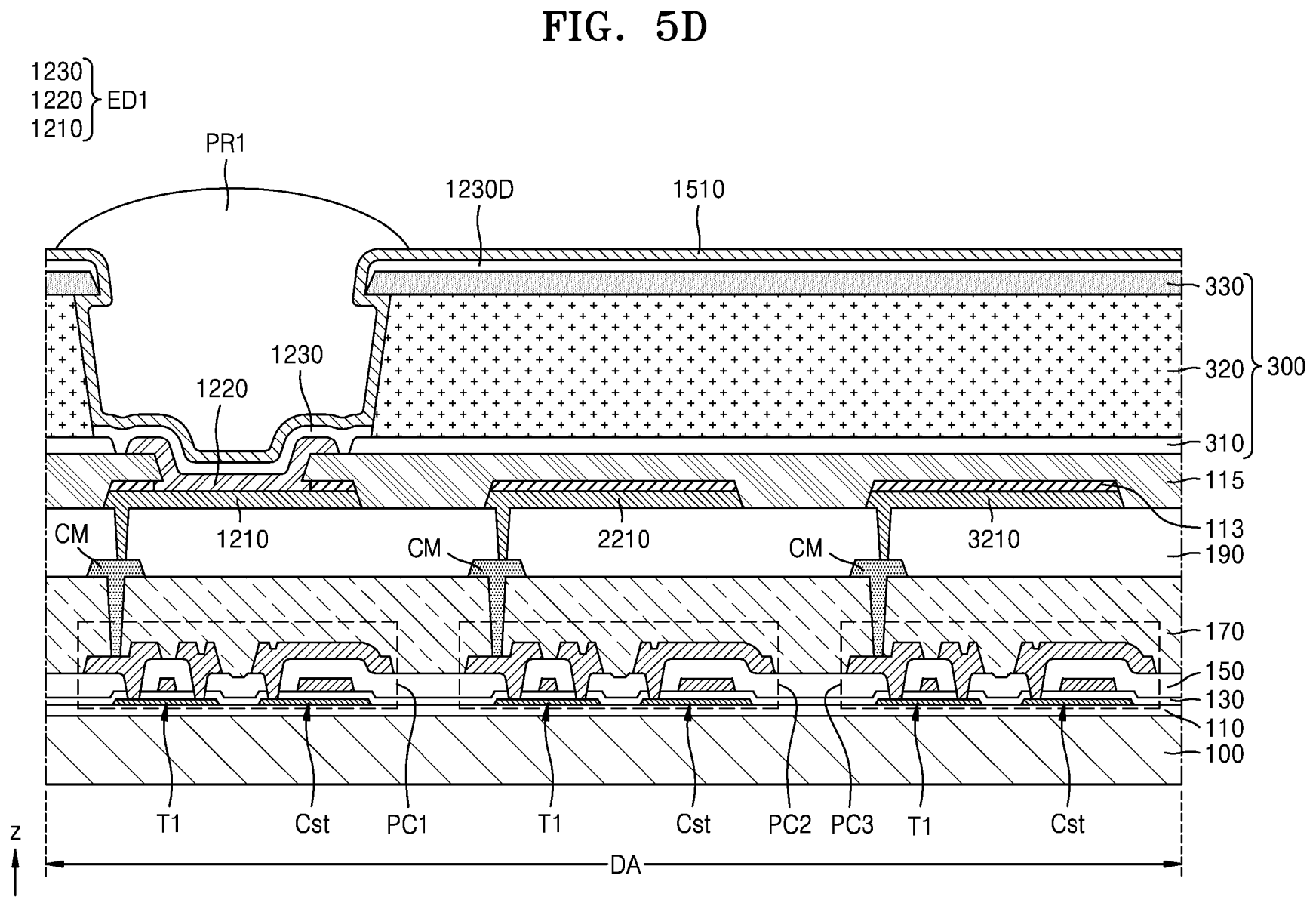

FIG. 5D 300
330
320
310
115
113
190
170
150
130
110
100
1510
1230D
3210
2210
1210
1220
1230
PR1
1230
1220
1210
ED1
CM
CM
CM
Cst
T1
PC3
PC2
Cst
T1
PC1
Cst
T1
DA
z 300
330
320
310
115
113
190
170
150
130
110
100
T
OP2
113OP2
2220
2210
115OP2
3210
T
1230D
1230
1220
1210
OP1
1230
1220
1210
ED1
CM
CM
CM
Cst
T1
PC3
PC2
Cst
T1
PC1
Cst
T1
DA
Z

FIG. 5G

FIG. 5H 300
330
320
310
115
113
190
170
150
130
110
100
3210
2230D
2510
2230
OP2
2220
2210
1230D
1510
1230
OP1
1220
1210
CM
PC1
PC2
PC3
Cst
T1
DA
1230
1220
1210
ED1
2230
2220
2210
ED2
Z

FIG. 5K

DISPLAY APPARATUS WITH CONDUCTIVE BANK LAYER AND MANUFACTURING METHOD THEREOF

CROSS-REFERENCE TO RELATED APPLICATION

This application claims priority to and benefits of Korean Patent Application No. 10-2022-0165101 under 35 U.S.C. § 119, filed in the Korean Intellectual Property Office on Nov. 30, 2022, the entire contents of which are incorporated herein by reference.

BACKGROUND

1. Technical Field

One or more embodiments relate to a display apparatus and a method of manufacturing the display apparatus having improved electrical characteristics and display quality.

2. Description of the Related Art

Display apparatuses are used to visually display data. The display apparatuses may provide images by using light-emitting diodes. The use of display apparatuses is becoming increasingly diverse, and as a result, various designs to improve the quality have been attempted.

It is to be understood that this background of the technology section is, in part, intended to provide useful background for understanding the technology. However, this background of the technology section may also include ideas, concepts, or recognitions that were not part of what was appreciated by those skilled in the pertinent art prior to a corresponding effective filing date of the subject matter disclosed herein.

SUMMARY

Embodiments provide a display apparatus having improved electrical characteristics and display quality.

Embodiments also provide a manufacturing method of a display apparatus having improved electrical characteristics and display quality.

However, embodiments of the disclosure are not limited to those set forth herein. The above and other embodiments will become more apparent to one of ordinary skill in the art to which the disclosure pertains by referencing the detailed description of the disclosure given below.

Additional aspects will be set forth in part in the description which follows and, in part, will be apparent from the description, or may be learned by practice of the presented embodiments of the disclosure.

According to one or more embodiments, a display apparatus includes a first sub-pixel electrode, a conductive bank layer disposed on the first sub-pixel electrode and including a first opening overlapping the first sub-pixel electrode in a plan view, an insulating layer disposed between a peripheral portion of the first sub-pixel electrode and the conductive bank layer, a first intermediate layer disposed on the first sub-pixel electrode in the first opening of the conductive bank layer, and a first counter electrode disposed on the first intermediate layer in the first opening of the conductive bank layer. The conductive bank layer comprises a first conductive layer, a second conductive layer disposed on the first conductive layer, and a third conductive layer disposed on the second conductive layer. The first counter electrode has a width greater than a width of the first intermediate layer. The first counter electrode is in direct contact with the conductive bank layer.

An edge of the first intermediate layer may be spaced apart from the first conductive layer of the conductive bank layer.

The third conductive layer may include a tip protruding toward the first opening from a point where a side surface of the second conductive layer meets a bottom surface of the third conductive layer.

The display apparatus may further include a dummy counter electrode separated from the first counter electrode by the tip. The first counter electrode and the dummy counter electrode may include a same material.

The dummy counter electrode may be in direct contact with an upper surface of the conductive bank layer.

The first counter electrode may be in direct contact with a portion of an upper surface of the first conductive layer from a second point where the upper surface of the first conductive layer meets a side surface of the second conductive layer to an edge of the first conductive layer.

The first conductive layer and the second conductive layer may include different materials.

The second conductive layer may include at least one of a metal and a conductive ceramic.

The second conductive layer may include at least one of aluminum, magnesium, molybdenum, tungsten, nickel, a magnesium oxide, and a titanium nitride.

The second conductive layer may have a structure of a sub-conductive layer including a metal and a sub-conductive layer including a conductive ceramic.

According to one or more embodiment, a method of manufacturing a display apparatus, the method including forming a first sub-pixel electrode, forming a conductive bank layer including a first opening overlapping the first sub-pixel electrode in a plan view, the conductive bank layer disposed on the first sub-pixel electrode with an insulating layer between a peripheral portion of the first sub-pixel electrode and the conductive bank layer, forming a first intermediate layer disposed on the first sub-pixel electrode in the first opening, increasing a temperature of the conductive bank layer, and forming a first counter electrode disposed on the first intermediate layer in the first opening. The conductive bank layer includes a first conductive layer, a second conductive layer disposed on the first conductive layer, and a third conductive layer disposed on the second conductive layer. The first counter electrode has the width greater than the width of the first intermediate layer. The first counter electrode is in direct contact with the conductive bank layer.

An edge of the first intermediate layer may be spaced apart from the first conductive layer of the conductive bank layer.

The forming of the conductive bank layer may include forming the first opening such that the third conductive layer may include a tip protruding toward the first opening from a point where a side surface of the second conductive layer meets a bottom surface of the third conductive layer.

The forming of the first counter electrode may further include forming a dummy counter electrode disposed on the conductive bank layer. The dummy counter electrode may be separated from the first counter electrode by the tip. The first counter electrode and the dummy counter electrode may include a same material.

The dummy counter electrode may be in direct contact with an upper surface of the conductive bank layer.

The first counter electrode may be in direct contact with a portion of an upper surface of the first conductive layer from a second point where the upper surface of the first conductive layer meets a side surface of the second conductive layer to an edge of the first conductive layer.

The insulating layer may include an inorganic insulating material.

A material of the second conductive layer may include at least one of a metal and a conductive ceramic.

The second conductive layer may include at least one of aluminum, magnesium, molybdenum, tungsten, nickel, a magnesium oxide, and a titanium nitride.

The second conductive layer may have a structure including a sub-conductive layer including a metal and a sub-conductive layer including a conductive ceramic.

BRIEF DESCRIPTION OF THE DRAWINGS

An additional appreciation according to the embodiments of the disclosure will become more apparent by describing in detail the embodiments thereof with reference to the accompanying drawings, wherein:

FIGS. 3A to 3D are schematic cross-sectional views of a process for manufacturing a display apparatus according to an embodiment;

FIGS. 5A to 5K are schematic cross-sectional views of a process for manufacturing a display apparatus according to another embodiment.

DETAILED DESCRIPTION OF THE EMBODIMENTS

Figure 1:
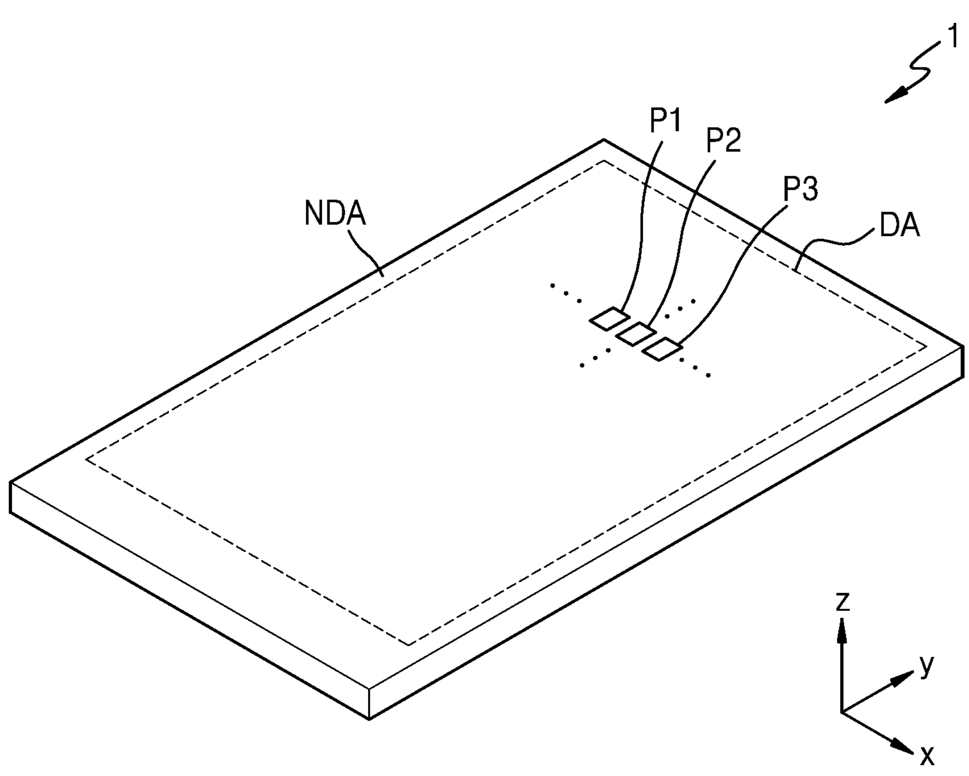
FIG. 1 is a schematic perspective view of a display apparatus according to an embodiment.

Unless otherwise specified, the illustrated embodiments are to be understood as providing features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

As used herein, the term "and/or" includes any and all combinations of one or more of the associated listed items. For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Also, like reference numerals denote like elements and redundant descriptions of the same constituent elements are omitted.

Although the terms "first." "second." and the like may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising." "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on." "directly connected to," or "directly coupled to" another element or layer, there are no intervening elements or layers present. To this end, the term "connected" may refer to physical, electrical, and/or fluid connection, with or without intervening elements.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

The x-axis, the y-axis, and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within +30%, 20%. 10%, 5% of the stated value.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

FIG. 1 is a schematic perspective view of a display apparatus 1 according to an embodiment.

Referring to FIG. 1, the display apparatus 1 may include a display area DA and a non-display area NDA adjacent to (e.g., located outside or surrounding) the display area DA. The display area DA may display an image through a first sub-pixel P1, a second sub-pixel P2, and a third sub-pixel P3 arranged in the display area DA. The non-display area NDA may be arranged outside the display area DA and may not display an image. The non-display area NDA may be adjacent to or may surround (e.g., entirely surround) the display area DA. A driver and the like for providing an electrical signal or power to the display area DA may be arranged in the non-display area NDA. A pad may be arranged in the non-display area NDA. An electronic component, a printed circuit board, and the like may be electrically connected by the pad.

In an embodiment of FIG. 1, the display area DA may be a polygon (e.g., a rectangle), and a length of the display area DA in an x direction may be less than a length of the display area DA in a y direction. In another embodiment, the display area DA may be a polygon (e.g., a rectangle), and a length of the display area DA in the y direction may be less than a length of the display area DA in the x direction. Although FIG. 1 illustrates that the display area DA is approximately rectangular, the disclosure is not limited thereto. In another embodiment, the display area DA may have various shapes, such as an N-gonal shape, where N is a natural number of 3 or greater, a circular or oval shape, or the like. Although FIG. 1 illustrates the display area DA having a corner of a vertex shape at which a straight line meets another straight line. In another embodiment, the display area DA may have a polygonal shape with rounded corners.

The display apparatus 1 may be applied to various products. For example, the display apparatus 1 may be applied to portable electronic devices, such as a mobile phone, a smart phone, a tablet personal computer (PC), a mobile communication terminal, an electronic organizer, an electronic book, a portable multimedia player (PMP), a navigation device, an ultra mobile PC (UMPC), and the like. In other embodiments, the display apparatus 1 may be applied to a television, a notebook computer, a monitor, a billboard, the Internet of things (IOT), and the like. For example, the display apparatus 1 according to an embodiment may be applied to wearable devices, such as a smart watch, a watch phone, a glasses-type display, a head mounted display (HMD), and the like. For example, the display apparatus 1 according to an embodiment may be used as an instrument panel of a vehicle, a center information display (CID) disposed in the center fascia or dashboard of a vehicle, a room mirror display in lieu of a side mirror of a vehicle, or a display screen disposed at the rear surface of a front seat as an entertainment device for a rear seat of a vehicle.

Figure 2:
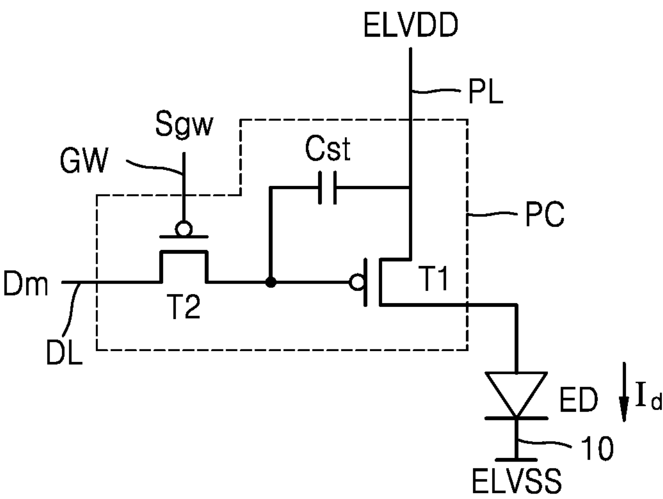
FIG. 2 is a schematic diagram of an equivalent circuit of a light-emitting diode corresponding to each of a first sub-pixel, a second sub-pixel, and a third sub-pixel of a display apparatus according to an embodiment, and a sub-pixel circuit electrically connected to the light-emitting diode.

FIG. 2 is a schematic diagram of an equivalent circuit of a light-emitting diode ED corresponding to each of a first sub-pixel P1, a second sub-pixel P2, and a third sub-pixel P3 of a display apparatus according to an embodiment, and a sub-pixel circuit PC electrically connected to the light-emitting diode ED.

Referring to FIG. 2, the light-emitting diode ED may be electrically connected to the sub-pixel circuit PC, and the sub-pixel circuit PC may include a first transistor T1, a second transistor T2, and a storage capacitor Cst. A sub-pixel electrode (e.g., an anode) of the light-emitting diode ED may be electrically connected to the first transistor T1, and a counter electrode (e.g., a cathode) of the light-emitting diode ED may be electrically connected to a common voltage supply line 10 and may receive a voltage corresponding to a common voltage ELVSS.

The second transistor T2 may transmit a data signal Dm input through a data line DL, to the first transistor T1, in response to a scan signal Sgw input through a scan line GW. For example, the data line DL may transmit the data signal Dm, and the scan line GW may transmit the scan signal Sgw. The second transistor T2 may transmit the data signal Dm to the first transistor T1 in response to the scan signal Sgw.

The storage capacitor Cst may be electrically connected to the second transistor T2 and a driving voltage line PL. The storage capacitor Cst may store a voltage corresponding to a difference between the voltage received from the second transistor T2 and a driving voltage ELVDD supplied through the driving voltage line PL.

The first transistor T1 may be electrically connected to the driving voltage line PL and the storage capacitor Cst. The first transistor T1 may control a driving current Id flowing through the light-emitting diode ED from the driving voltage line PL, in response to the voltage stored in the storage capacitor Cst. The light-emitting diode ED may emit light having a luminance (e.g., a certain or selectable luminance) due to the driving current Id.

In FIG. 2, the sub-pixel circuit PC may include two transistors and a storage capacitor. However, the disclosure is not limited thereto. The sub-pixel circuit PC of a display apparatus according to another embodiment may include three or more transistors and two or more capacitors.

FIGS. 3A to 3D are schematic cross-sectional views of a process for manufacturing the display apparatus 1 according to an embodiment.

Figure 3A:
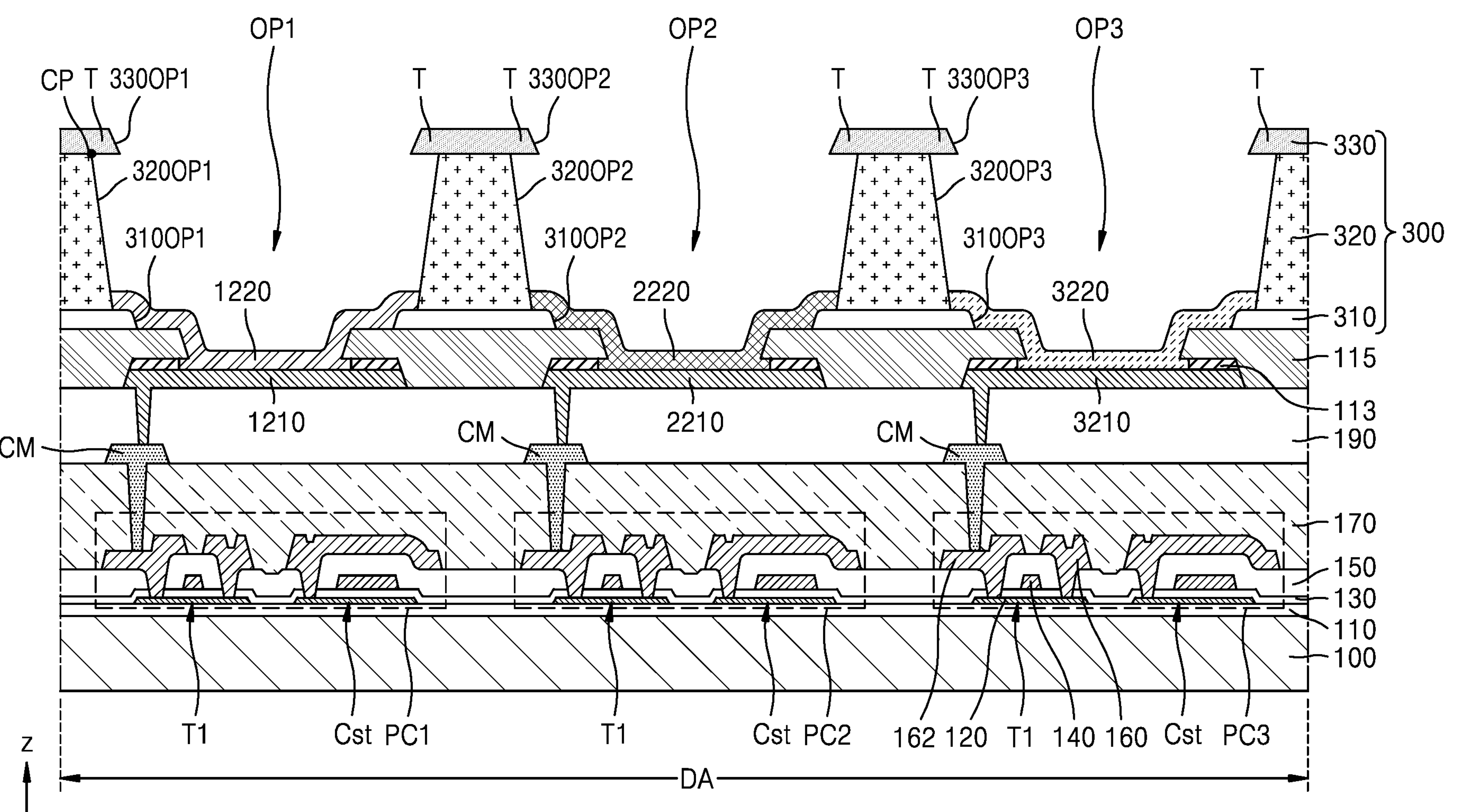

Referring to FIG. 3A, a sub-pixel electrode (e.g., a first sub-pixel electrode 1210, a second sub-pixel electrode 2210, and a third sub-pixel electrode 3210) may be formed on a substrate 100. The first sub-pixel electrode 1210, the second sub-pixel electrode 2210, and the third sub-pixel electrode 3210 may each be formed as a (semi-)transparent electrode or a reflective electrode. In case that the first sub-pixel electrode 1210, the second sub-pixel electrode 2210, and the third sub-pixel electrode 3210 are (semi-)transparent electrodes, the first sub-pixel electrode 1210, the second sub-pixel electrode 2210, and the third sub-pixel electrode 3210 may each be formed of a transparent conductive material, for example, an indium tin oxide (ITO), an indium zinc oxide (IZO), a zinc oxide (ZnO), an indium oxide ($In_2O_3$), an indium gallium oxide (IGO), an aluminum-doped zinc oxide (AZO), or a combination thereof. In case that the first sub-pixel electrode 1210, the second sub-pixel electrode 2210, and the third sub-pixel electrode 3210 are formed of a reflective electrode, a reflective film may be formed of (or include) Ag, Mg, Al, Pt, Pd, Au, Ni, Nd, Ir, Cr, a compound thereof, or the like, and a film formed of ITO, IZO, ZnO, or $In_2O_3$ may be formed on the reflective film. In an embodiment, the first sub-pixel electrode 1210, the second sub-pixel electrode 2210, and the third sub-pixel electrode 3210 may include an ITO layer, an Ag layer, and an ITO layer, which are sequentially stacked one another. For example, each of the first sub-pixel electrode 1210, the second sub-pixel electrode 2210, and the third sub-pixel electrode 3210 may have a triple layered structure including an ITO layer, an Ag layer, and an ITO layer.

The substrate 100 may include a glass material or polymer resin. The substrate 100 may have a base layer including polymer resin and an inorganic barrier layer, which are stacked each other. The polymer resin of the substrate 100 may include at least one of polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate, cellulose triacetate (TAC), cellulose acetate propionate (CAP), and the like.

Before forming the first sub-pixel electrode 1210, the second sub-pixel electrode 2210, and the third sub-pixel electrode 3210, a first sub-pixel circuit PC1, a second sub-pixel circuit PC2, and a third sub-pixel circuit PC3 may be formed on the substrate 100. For example, the first sub-pixel electrode 1210, the second sub-pixel electrode 2210, and the third sub-pixel electrode 3210 may be formed on the substrate 100 on which the first sub-pixel circuit PC1, a second sub-pixel circuit PC2, and a third sub-pixel circuit PC3 are disposed.

In an embodiment, each of the first sub-pixel circuit PC1, the second sub-pixel circuit PC2, and the third sub-pixel circuit PC3 may include transistors and a storage capacitor, as in the sub-pixel circuit PC of FIG. 2. In FIG. 3A, the first transistor T1 and the storage capacitor Cst may be included in each of the first sub-pixel circuit PC1, the second sub-pixel circuit PC2, and the third sub-pixel circuit PC3.

A buffer layer 110 may be disposed on an upper surface of the substrate 100. The buffer layer 110 may prevent infiltration of impurities into a semiconductor layer of a transistor. The buffer layer 110 may include an inorganic insulating material, such as a silicon nitride, a silicon oxynitride, and a silicon oxide, and may be a single layer or multilayer including the inorganic insulating material described above.

The first transistor T1 may include a semiconductor layer 120 on the buffer layer 110 and a first gate electrode 140 overlapping a channel region of the semiconductor layer 120 in a view or direction (e.g., in a plan view). The semiconductor layer 120 may include a silicon-based semiconductor material (e.g., polysilicon). The semiconductor layer 120 may include a channel region, a first area, and a second area. The first area and the second area of the semiconductor layer 120 may be arranged in opposite sides of the channel region. The first area and the second area may include impurities having a higher concentration than the channel region. One of the first area and the second area may correspond to a source region and another thereof may correspond to a drain region.

A gate insulating layer 130 may be arranged between the semiconductor layer 120 and the first gate electrode 140. The gate insulating layer 130 may include an inorganic insulating material, such as a silicon nitride, a silicon oxynitride, and a silicon oxide. The gate insulating layer 130 may be a single layer or multilayer including an inorganic insulating material described above.

A first interlayer insulating layer 150 may be disposed on the first gate electrode 140. The first interlayer insulating layer 150 may include an inorganic insulating material, such as a silicon nitride, a silicon oxynitride, and a silicon oxide, and may be a single layer or multilayer including the inorganic insulating material described above.

A source electrode 160 and a drain electrode 162 may be electrically connected to the source region and the drain region of the semiconductor layer 120, respectively. A first organic insulating layer 170 may be disposed on the source electrode 160 and the drain electrode 162. The first organic insulating layer 170 may include an organic insulating material. The storage capacitor Cst may include a first capacitor electrode and a second capacitor electrode overlapping each other in a plan view.

A second organic insulating layer 190 may be disposed on the first organic insulating layer 170. The first sub-pixel electrode 1210, the second sub-pixel electrode 2210, and the third sub-pixel electrode 3210 may be disposed on the second organic insulating layer 190. Each of the first to third sub-pixel electrodes 1210, 2210, and 3210 may be electrically connected to a first transistor T1 of the corresponding sub-pixel circuit through a connection metal layer CM on the first organic insulating layer 170.

A conductive bank layer 300 having an opening overlapping a sub-pixel electrode may be formed on the sub-pixel electrode. For example, the conductive bank layer 300 may have a first opening OP1, a second opening OP2, and a third opening OP3 respectively corresponding to the first to third sub-pixel electrodes 1210, 2210, and 3210. The conductive bank layer 300 may be formed on the sub-pixel electrode (e.g., the first to third sub-pixel electrodes 1210, 2210, and 3210) with an insulating layer 115 disposed between (e.g., interposed between) the first to third sub-pixel electrodes 1210, 2210, and 3210 and the conductive bank layer 300. For example, the insulating layer 115 may be disposed in an area between adjacent ones of the first to third sub-pixel electrodes 1210, 2210, and 3210, and the conductive bank layer 300 may be disposed on the insulating layer 115. The first to third openings OP1, OP2, and OP3 of the conductive bank layer 300 may be formed by using dry and/or wet etching.

The insulating layer 115 may include an inorganic insulating layer, for example, an inorganic insulating material, such as a silicon nitride, a silicon oxide, and a silicon oxynitride, and may overlap the edges of the first to third sub-pixel electrodes 1210, 2210, and 3210. The insulating layer 115 may be provided between peripheral portions, or outer portions, of each of the first to third sub-pixel electrodes 1210, 2210, and 3210. The insulating layer 115 may be formed in the display area DA, and the insulating layer 115 may include openings respectively corresponding to the first to third openings OP1, OP2, and OP3 and formed through an etching process. A protection layer 113 may be provided between the insulating layer 115 and the peripheral portions, or the outer portions, of the first to third sub-pixel electrodes 1210, 2210, and 3210.

The protection layer 113 may protect the first to third sub-pixel electrodes 1210, 2210, and 3210 in a process for forming the first to third openings OP1, OP2, and OP3 of the conductive bank layer 300. The protection layer 113 may include a conductive oxide, such as ITO, IZO, an indium gallium zinc oxide (IGZO), an indium tin zinc oxide (ITZO), ZnO, AZO, a gallium doped zinc oxide (GZO), a zinc tin oxide (ZTO), a gallium tin oxide (GTO), and a fluorine doped tin oxide (FTO). However, the disclosure is not limited thereto.

The conductive bank layer 300 may include conductive layers. For example, the conductive bank layer 300 may include a first conductive layer 310, a second conductive layer 320, and a third conductive layer 330. The first conductive layer 310 may include a metal such as titanium. The second conductive layer 320 may include a metal and/or a conductive ceramic. For example, the metal of the second conductive layer 320 may include a metal element, such as aluminum, magnesium, molybdenum, tungsten, nickel, or a combination thereof. The conductive ceramic of the second conductive layer 320 may include a material, such as a magnesium oxide, a titanium nitride, or a combination thereof. The third conductive layer 330 and the first conductive layer 310 may include a same material, for example, a metal such as titanium. In another embodiment, the third conductive layer 330 may include a material different from the material of the first conductive layer 310.

The first conductive layer 310, the second conductive layer 320, and the third conductive layer 330 may respectively include openings corresponding to the first to third openings OP1, OP2, and OP3 of the conductive bank layer 300. For example, the first conductive layer 310, the second conductive layer 320, and the third conductive layer 330 may respectively include openings 310OP1, 320OP1, and 330OP1 overlapping the first sub-pixel electrode 1210. The opening 310OP1 of the first conductive layer 310, the opening 320OP1 of the second conductive layer 320, and the opening 330OP1 of the third conductive layer 330 may overlap one another and may form the first opening OP1 of the conductive bank layer 300.

The first conductive layer 310, the second conductive layer 320, and the third conductive layer 330 may respectively include openings 310OP2, 320OP2, and 330OP2 overlapping the second sub-pixel electrode 2210. The opening 310OP2 of the first conductive layer 310, the opening 320OP2 of the second conductive layer 320, and the opening 330OP2 of the third conductive layer 330 may overlap one another and may form the second opening OP2 of the conductive bank layer 300. The first conductive layer 310, the second conductive layer 320, and the third conductive layer 330 may respectively include openings 310OP3, 320OP3, and 330OP3 overlapping the third sub-pixel electrode 3210. The opening 310OP3 of the first conductive layer 310, the opening 320OP3 of the second conductive layer 320, and the opening 330OP3 of the third conductive layer 330 may overlap one another in a plan view and form the third opening OP3 of the conductive bank layer 300.

The conductive bank layer 300 may have an overhang structure. The second conductive layer 320 may include a material having an etching selectivity different from those of the first conductive layer 310 and the third conductive layer 330. In case that the material corresponding to the second conductive layer 320 is further etched, the third conductive layer 330 of the conductive bank layer 300 may have a tip T protruding toward the first opening OP1 of the conductive bank layer 300. For example, a portion of the third conductive layer 330 facing the first opening OP1 may protrude toward the first opening OP1 from a point CP where a side surface of the second conductive layer 320 facing the first opening OP1 meets a lower surface of the third conductive layer 330. For example, the portion of the third conductive layer 330 facing the first opening OP1 may protrude toward the first opening OP1 from a boundary (e.g., the point CP) between a side surface of the second conductive layer 320 facing the first opening OP1 and the lower surface of the third conductive layer 330. Thus, the tip T may be formed toward the first opening OP1.

A first intermediate layer 1220 may be formed through (or be formed in) the first opening OP1 of the conductive bank layer 300. In some embodiments, the first intermediate layer 1220 may be formed by depositing a material forming the first intermediate layer 1220 through a first mask including an opening area overlapping the first opening OP1 of the conductive bank layer 300.

The first intermediate layer 1220 may include a light-emitting layer, a first functional layer, and a second functional layer. The light-emitting layer of the first intermediate layer 1220 may emit a first color light. The first functional layer and the second functional layer of the first intermediate layer 1220 may be respectively disposed below and above the light-emitting layer and include an organic material. The first functional layer may include a hole transport layer (HTL) and/or a hole injection layer (HIL). The second functional layer may include an electron transport layer (ETL) and/or an electron injection layer (EIL).

For example, a second intermediate layer 2220 may be formed through (or be formed in) the second opening OP2 of the conductive bank layer 300, and a third intermediate layer 3220 may be formed through the third opening OP3 of the conductive bank layer 300. The second intermediate layer 2220 may be formed through deposition by using a second mask including an opening area overlapping the second opening OP2 of the conductive bank layer 300. The third intermediate layer 3220 may be formed through deposition by using a third mask including an opening area overlapping the third opening OP3 of the conductive bank layer 300.

The second intermediate layer 2220 may include a light-emitting layer, a first functional layer, and a second functional layer. The light-emitting layer of the second intermediate layer 2220 may emit a second color light. The first functional layer and the second functional layer of the second intermediate layer 2220 may be respectively disposed below and above the light-emitting layer and include an organic material. The third intermediate layer 3220 may include a light-emitting layer, a first functional layer, and a second functional layer. The light-emitting layer of the third intermediate layer 3220 may emit a third color light, and the first functional layer and the second functional layer of the third intermediate layer 3220 may be respectively disposed below and above the light-emitting layer and include an organic material.

Due to a deposition angle of the deposition material, the material corresponding to each of the first to third intermediate layers 1220, 2220, and 3220 may overlap or may be in direct contact with the conductive bank layer 300. For example, as illustrated in FIG. 3A, a peripheral portion of the first intermediate layer 1220 may overlap and may be in direct contact with a portion of the conductive bank layer 300 corresponding to the first opening OP1 (e.g., an upper surface of a portion of the first conductive layer 310 defining the opening 310OP1 and a portion of a side surface of the second conductive layer 320). A peripheral portion of the second intermediate layer 2220 may overlap and may be in direct contact with a portion of the conductive bank layer 300 corresponding to the second opening OP2 (e.g., an upper surface of a portion of the first conductive layer 310 defining the opening 310OP2 and a portion of a side surface of the second conductive layer 320). A peripheral portion of the third intermediate layer 3220 may overlap and may be in direct contact with a portion of the conductive bank layer 300 corresponding to the third opening OP3 (e.g., an upper surface of a portion of the first conductive layer 310 defining the opening 310OP3 and a portion of a side surface of the second conductive layer 320).

After the first intermediate layer 1220 is formed, a process to increase the temperature of the conductive bank layer 300 may be performed. For example, a current may flow through the conductive bank layer 300 and heat may be generated in the conductive bank layer 300 (e.g., joule heating). Thus, the temperature of the conductive bank layer 300 may be increased. For example, a current may be applied (e.g., directly applied) to the conductive bank layer 300 or a current may flow using an induced electromotive force. Thus, the temperature of the conductive bank layer 300 may be increased.

Figure 3B:
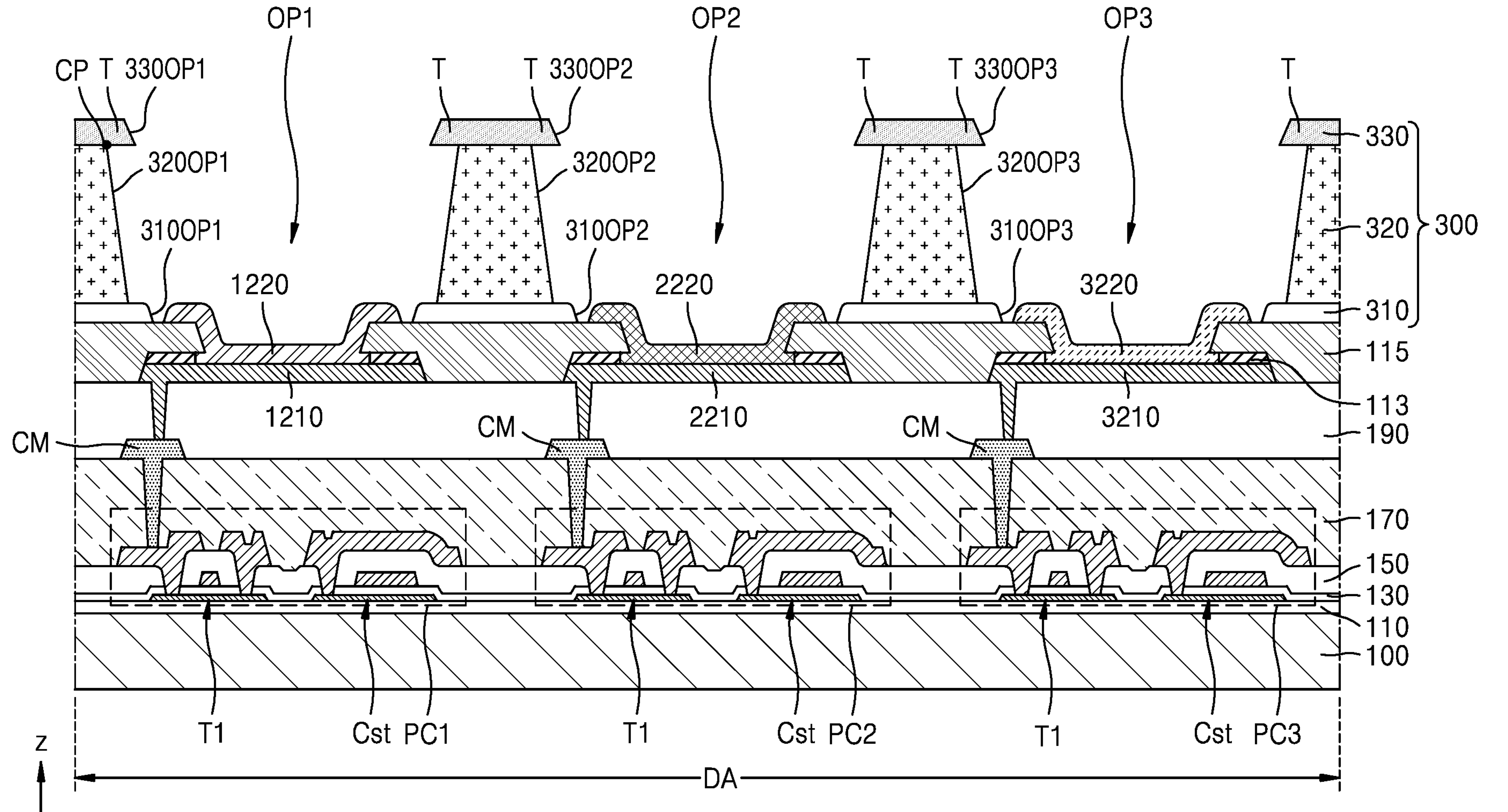

In some embodiments, the temperature of the conductive bank layer 300 may be about 100° ° C. to about 200° C. Due to the increase in the temperature of the conductive bank layer 300, the deposition material contacting and/or overlapping the conductive bank layer 300 may be vaporized and removed. For example, the portion of the first intermediate layer 1220 of FIG. 3A (e.g., a portion of the first intermediate layer 1220 deposited on the upper surface of the first conductive layer 310) may be removed. Thus, as illustrated in FIG. 3B, the first intermediate layer 1220 may be omitted from the upper surface of the first conductive layer 310. In some embodiments, the edge of the first intermediate layer 1220 may be spaced apart from the edge of the first conductive layer 310 corresponding to the first opening OP1 with a gap therebetween.

In case that the temperature of the conductive bank layer 300 is increased, a portion of the second intermediate layer 2220 and a portion of the third intermediate layer 3220 contacting and/or overlapping the conductive bank layer 300 may be vaporized and removed. Accordingly, as illustrated in FIG. 3B, the edge of the second intermediate layer 2220 may be spaced apart from the edge of the first conductive layer 310 corresponding to the second opening OP2, and the edge of the third intermediate layer 3220 may be spaced apart from the edge of the first conductive layer 310 corresponding to the third opening OP3. Although FIGS. 3A and 3B illustrate that the temperature of the conductive bank layer 300 is increased after forming the intermediate layer (e.g., the first to third intermediate layers 1220, 2220, and 3220), the disclosure is not limited thereto. The temperature of the conductive bank layer 300 may be increased during the forming of the intermediate layer, and the deposition of a material corresponding to the intermediate layer on the conductive bank layer 300 may be prevented.

Figure 3C:
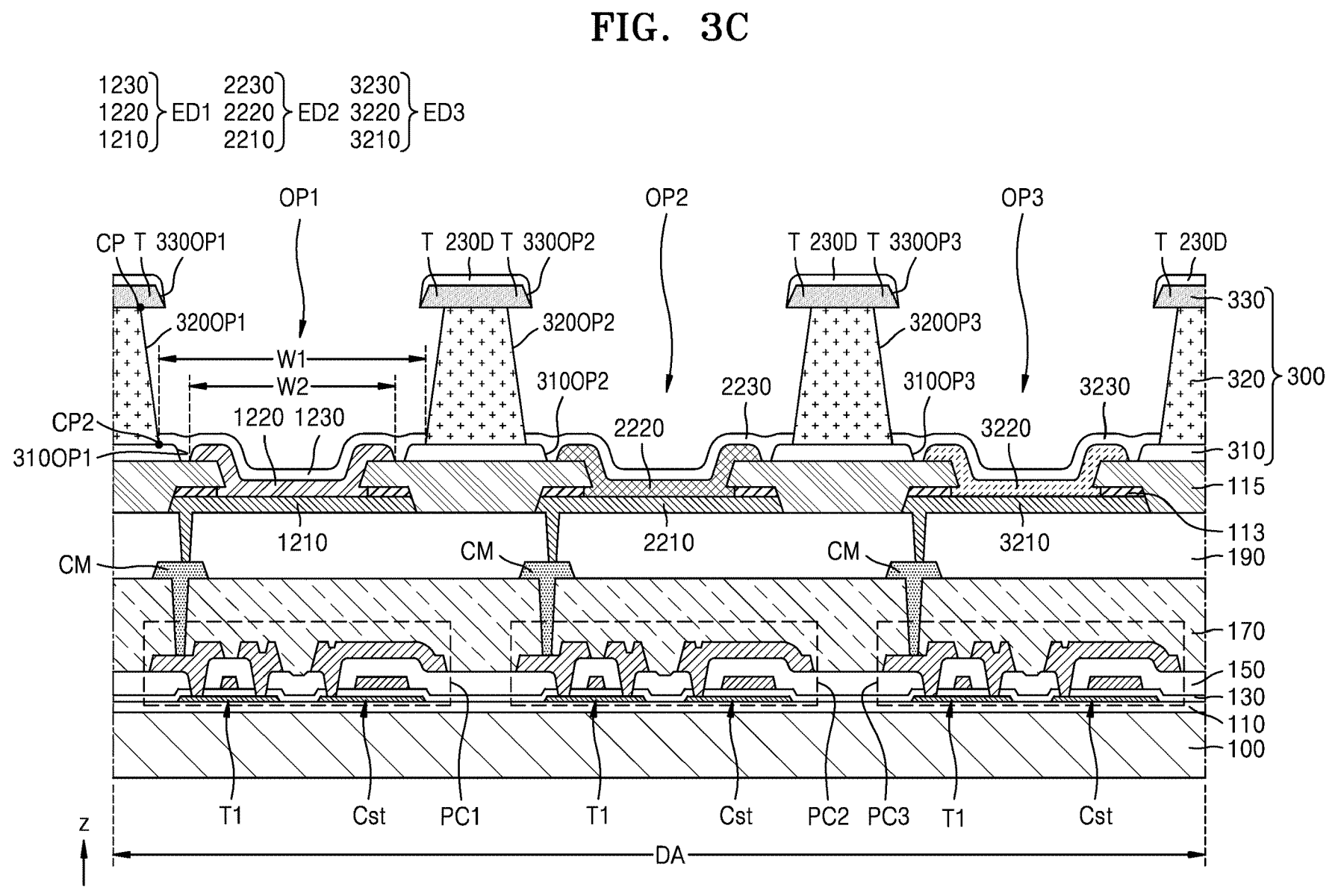

Referring to FIG. 3C, a counter electrode may be formed on the intermediate layer. For example, a first counter electrode 1230, a second counter electrode 2230, and a third counter electrode 3230 may be formed on the first to third intermediate layers 1220, 2220, and 3220, respectively. The first to third counter electrodes 1230, 2230, and 3230 may each include a conductive material having a low work function. For example, the first to third counter electrodes 1230, 2230, and 3230 may include a (semi-)transparent layer including, e.g., at least one of silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), and an alloy thereof. However, the disclosure is not limited thereto. In other embodiments, the first to third counter electrodes 1230, 2230, and 3230 may further include a layer including at least one of ITO, IZO, ZnO, and $In_2O_3$ on a (semi-)transparent layer including the material described above.

The first counter electrode 1230 may overlap and may be in direct contact with the first intermediate layer 1220 through the first opening OP1 of the conductive bank layer 300. The first counter electrode 1230 may be formed by a deposition method, and a material for forming the first counter electrode 1230 may be deposited in a direction perpendicular or oblique to the substrate 100. Accordingly, the first counter electrode 1230 may pass through the edge of the first intermediate layer 1220 to be in direct contact with the conductive bank layer 300. A width W1 of the first counter electrode 1230 may be greater than a width W2 of the first intermediate layer 1220, and the first counter electrode 1230 may be in direct contact with the conductive bank layer 300. In FIG. 3C, the first counter electrode 1230 may be in direct contact with the upper surface of the first conductive layer 310 and a portion of the side surface of the second conductive layer 320. For example, a portion of the upper surface of the first conductive layer 310, from a point (hereinafter, referred to as a second point CP2) where the upper surface of the first conductive layer 310 meets the side surface of the second conductive layer 320 to the edge of the first conductive layer 310, may be in contact with (e.g., entirely in contact with) the first counter electrode 1230. For example, upper surfaces of the first conductive layer 310 and the first intermediate layer 1220 may be in contact with the first counter electrode 1230 at a boundary (e.g., the second point CP2) between the upper surface of the first conductive layer 310 and the side surface of the second conductive layer 320. A lower portion of the side surface of the second conductive layer 320 may also be in contact with the first counter electrode 1230.

A deposition process for forming the first counter electrode 1230 may be performed in case that the heating of the conductive bank layer 300 is stopped (e.g., in case that the application of a current for Joule heating is stopped). Since the deposition process for forming the first counter electrode 1230 may be performed at a temperature higher than a heating temperature (e.g., about 100° ° C. to about 200° C.) of the conductive bank layer 300, a process to cool the conductive bank layer 300 may not be carried out (or may be unnecessary), but the disclosure is not limited thereto. In another embodiment, a process of cooling the conductive bank layer 300 may be carried out according to the process of depositing the material for forming the first counter electrode 1230.

For example, the second counter electrode 2230 and the third counter electrode 3230 may each overlap in a plan view and/or may be in direct contact with the second intermediate layer 2220 and the third intermediate layer 3220, respectively, through the second opening OP2 and the third opening OP3 of the conductive bank layer 300. The second counter electrode 2230 may pass over the edge of the second intermediate layer 2220 and be in direct contact with the conductive bank layer 300. The third counter electrode 3230 may pass over the edge of the third intermediate layer 3220 and be in direct contact with the conductive bank layer 300. The width of the second counter electrode 2230 may be greater than the width of the second intermediate layer 2220, and the width of the third counter electrode 3230 may be greater than the width of the third intermediate layer 3220.

The material corresponding to the first intermediate layer 1220 overlapping and/or contacting the conductive bank layer 300 may be removed through the process of increasing the temperature of the conductive bank layer 300 described above. Thus, a contact area between the first counter electrode 1230 and the conductive bank layer 300 may be increased. For example, contact areas between the second counter electrode 2230 and the conductive bank layer 300 and between the third counter electrode 3230 and the conductive bank layer 300 may be increased.

The counter electrode (e.g., the first to third counter electrodes 1230, 2230, and 3230) may be formed by using an open mask having an opening area corresponding to the display area DA. As described above, in case that the temperature of the conductive bank layer 300 is increased, the material corresponding to the intermediate layer may not exist on the conductive bank layer 300. Unlike the intermediate layer, the first to third counter electrodes 1230, 2230, and 3230 may exist on the conductive bank layer 300. The deposition material corresponding to the first to third counter electrodes 1230, 2230, and 3230 may also exist on an upper surface of the conductive bank layer 300 (e.g., an upper surface of the third conductive layer 330), such that a dummy counter electrode 230D having a same material as the first to third counter electrodes 1230, 2230, and 3230 may formed. The conductive bank layer 300 may have an overhang structure due to the tip T and a dummy counter electrode 230D may exist on the upper surface of the third conductive layer 330. Thus, the dummy counter electrode 230D may be spatially separated from the first to third counter electrodes 1230, 2230, and 3230.

The first sub-pixel electrode 1210, the first intermediate layer 1220, and the first counter electrode 1230 may overlap one another in a plan view through the first opening OP1 of the conductive bank layer 300. The first sub-pixel electrode 1210, the first intermediate layer 1220, and the first counter electrode 1230 may form a first light-emitting diode ED1 and emit the first color light. The second sub-pixel electrode 2210, the second intermediate layer 2220, and the second counter electrode 2230 may overlap one another through the second opening OP2 of the conductive bank layer 300. The second sub-pixel electrode 2210, the second intermediate layer 2220, and the second counter electrode 2230 may form a second light-emitting diode ED2 and emit the second color light. The third sub-pixel electrode 3210, the third intermediate layer 3220, and the third counter electrode 3230 may overlap one another through the third opening OP3 of the conductive bank layer 300. The third sub-pixel electrode 3210, the third intermediate layer 3220, and the third counter electrode 3230 may form a third light-emitting diode ED3 and emit the third color light.

Figure 4A:
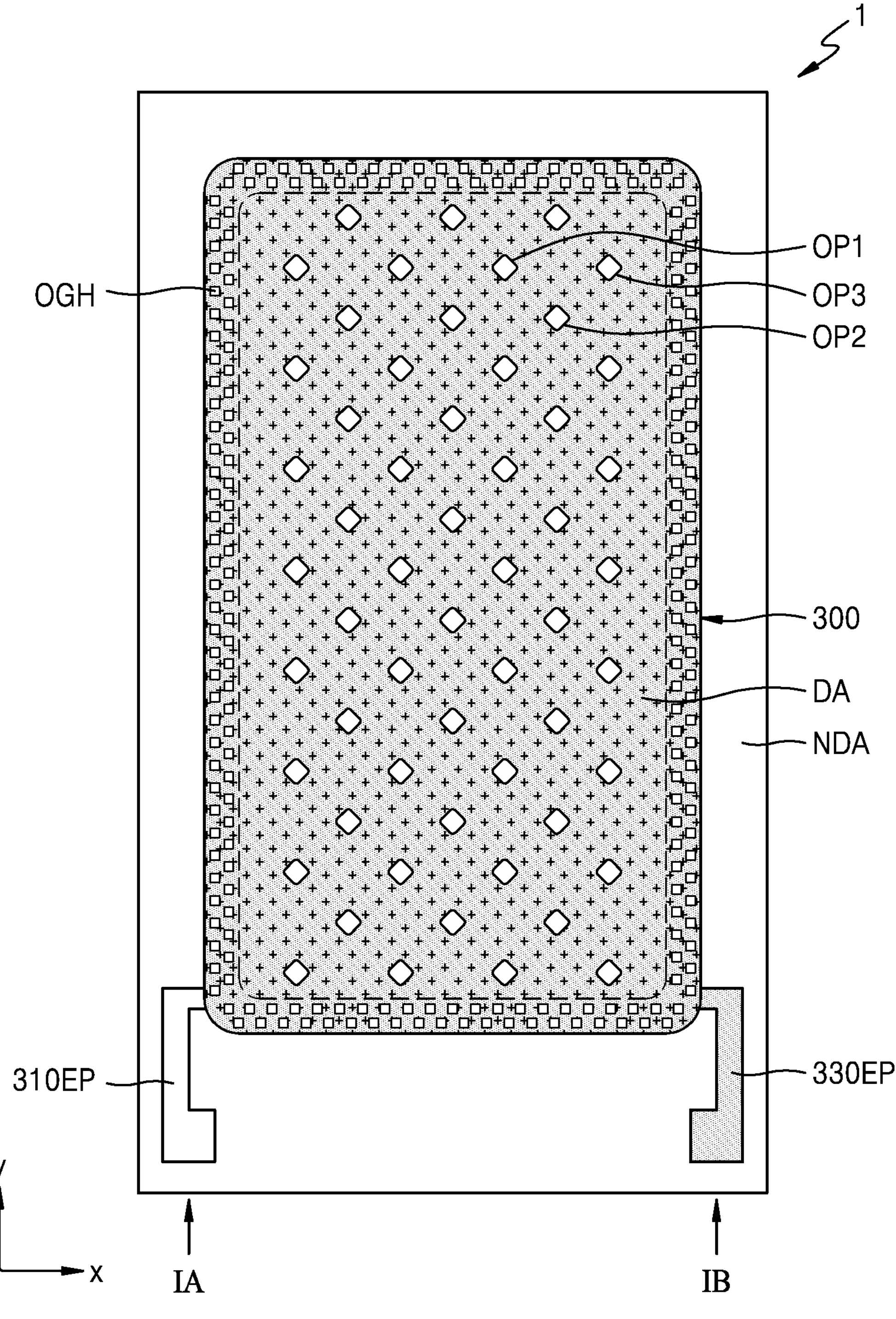
FIG. 4A is a schematic plan view of a conductive bank layer in a display apparatus according to an embodiment.

The first to third counter electrodes 1230, 2230, and 3230 may be separated and spaced apart from one another. The first to third counter electrodes 1230, 2230, and 3230 may contact (e.g., directly contact) the conductive bank layer 300 and be electrically connected to one another. In FIG. 3C, the conductive bank layer 300 is separated by the first to third openings OP1, OP2, and OP3. However, the conductive bank layer 300 may have a net structure including the first to third openings OP1, OP2, and OP3 as illustrated in FIG. 4A and the first to third counter electrodes 1230, 2230, and 3230 may be electrically connected to one another through the conductive bank layer 300.

Referring to FIG. 3D, an encapsulation layer 500 may be formed on the first to third light-emitting diodes ED1, ED2, and ED3. The encapsulation layer 500 may include an inorganic encapsulation layer and an organic encapsulation layer. In FIG. 3D, the encapsulation layer 500 may include a first inorganic encapsulation layer 510, a second inorganic encapsulation layer 530, and an organic encapsulation layer 520. The organic encapsulation layer 520 may be disposed between the first inorganic encapsulation layer 510 and the second inorganic encapsulation layer 530.

The first inorganic encapsulation layer 510 and the second inorganic encapsulation layer 530 may each include at least one inorganic material of an aluminum oxide, a titanium oxide, a tantalum oxide, a hafnium oxide, a zinc oxide, a silicon oxide, a silicon nitride, and a silicon oxynitride. The inorganic materials of the first and second inorganic encapsulation layers 510 and 530 may be deposited by a method such as a chemical vapor deposition method. The first inorganic encapsulation layer 510 and the second inorganic encapsulation layer 530 may each be a single layer or multilayer including the materials described above. The organic encapsulation layer 520 may include a polymer-based material. The polymer-based material of the organic encapsulation layer 520 may include, e.g., acrylic resin, epoxy-based resin, polyimide, polyethylene, a combination thereof, or the like. In an embodiment, the organic encapsulation layer 520 may include acrylate.

Each of the first inorganic encapsulation layer 510, the second inorganic encapsulation layer 530, and the organic encapsulation layer 520 may cover (e.g., entirely cover) the display area DA. The first inorganic encapsulation layer 510 and the second inorganic encapsulation layer 530 may be formed by a chemical vapor deposition method. The first inorganic encapsulation layer 510 and the second inorganic encapsulation layer 530 having a relatively excellent or desirable step coverage, unlike the first to third counter electrodes 1230, 2230, and 3230, may not be separated from each other and may cover (e.g., entirely cover) the display area DA. For example, the first inorganic encapsulation layer 510 may be located on the dummy counter electrode 230D and may continuously overlap the upper and side surfaces of the third conductive layer 330, the side surface of the second conductive layer 320, the upper surfaces of the first conductive layer 310, and the first to third light-emitting diodes ED1, ED2, and ED3.

A portion of the organic encapsulation layer 520 may fill a portion of each of the first to third openings OP1, OP2, and OP3 of the conductive bank layer 300, and the upper surface of the organic encapsulation layer 520 may be substantially planar. The second inorganic encapsulation layer 530 may be disposed on the organic encapsulation layer 520.

Figure 4B:
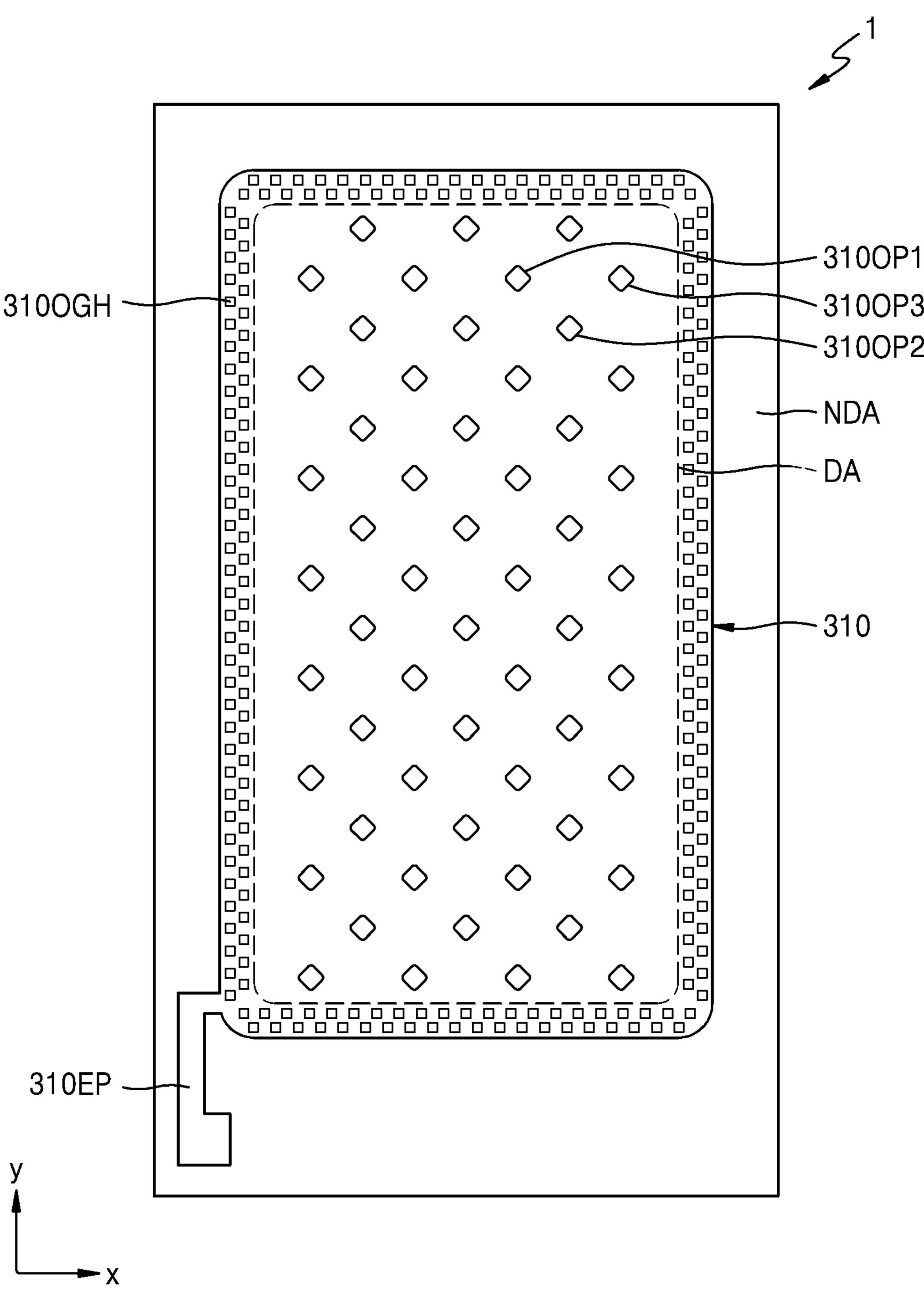
FIG. 4B is a schematic plan view of a first conductive layer of a conductive bank layer in a display apparatus according to an embodiment.
Figure 4C:
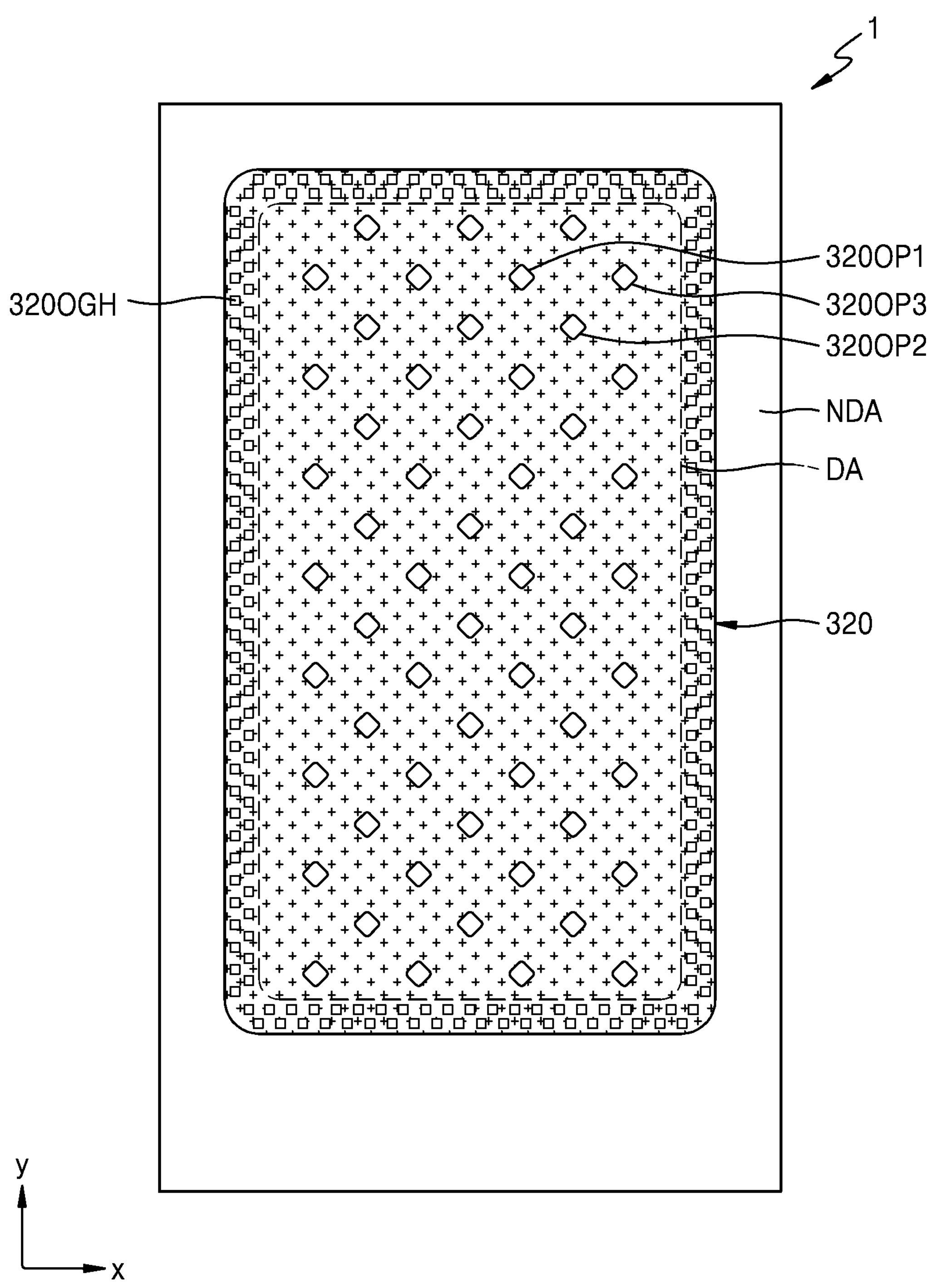
FIG. 4C is a schematic plan view of a second conductive layer of a conductive bank layer in a display apparatus according to an embodiment.
Figure 4D:
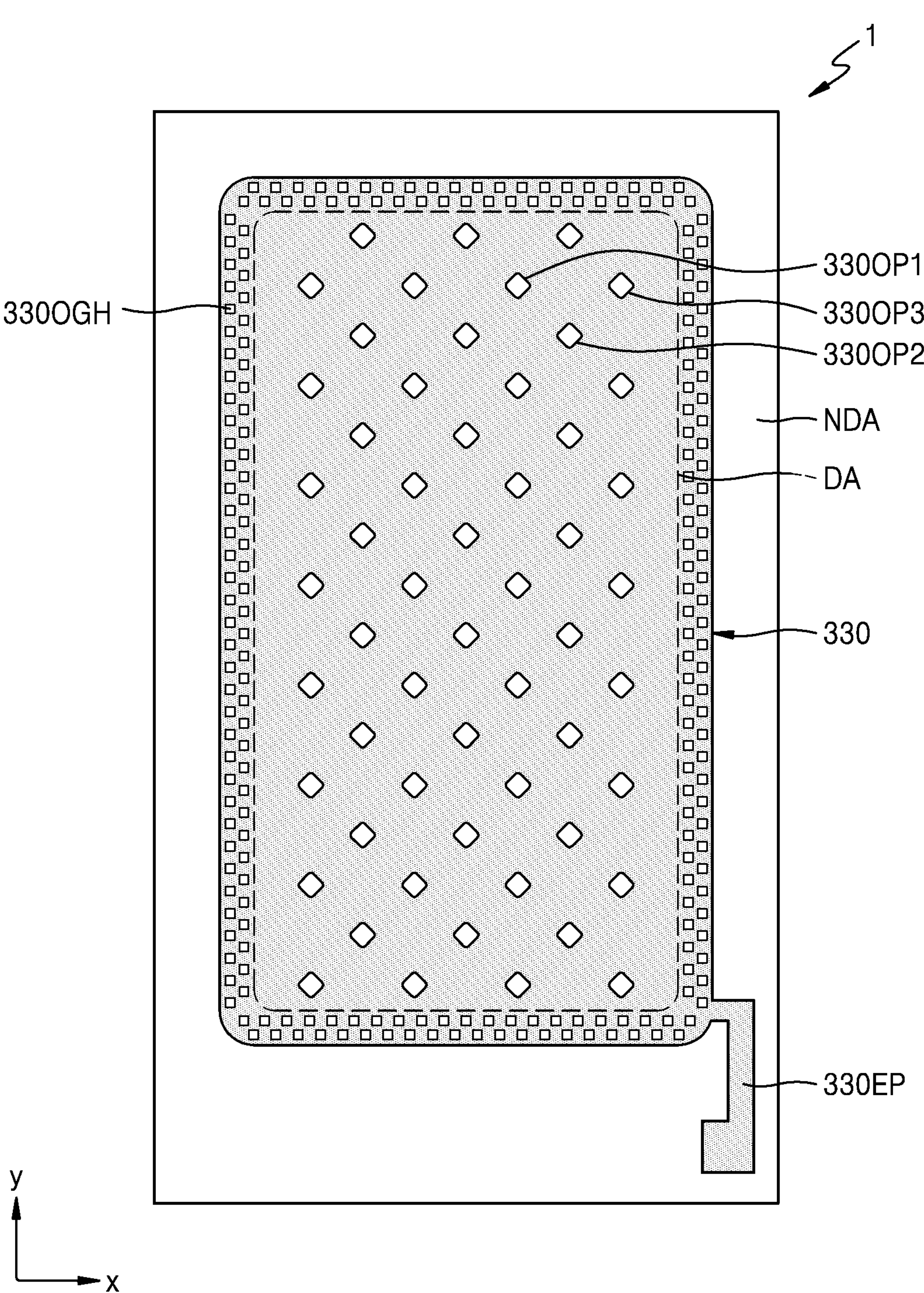
FIG. 4D is a schematic plan view of a third conductive layer of a conductive bank layer in a display apparatus according to an embodiment.

FIG. 4A is a schematic plan view of a conductive bank layer 300 in a display apparatus according to an embodiment. FIG. 4B is a schematic plan view of a first conductive layer 310 of a conductive bank layer 300 in a display apparatus 1 according to an embodiment. FIG. 4C is a schematic plan view of a second conductive layer 320 of a conductive bank layer 300 in a display apparatus 1 according to an embodiment. FIG. 4D is a schematic plan view of a third conductive layer 330 of a conductive bank layer 300 in a display apparatus 1 according to an embodiment.

Referring to FIG. 4A, the conductive bank layer 300 may include the first opening OP1, the second opening OP2, and the third opening OP3, which are located in the display area DA. As illustrated in FIG. 3D, the locations in a plan view of the first opening OP1, the second opening OP2, and the third opening OP3 may be substantially the same as those of the first light-emitting diode ED1, the second light-emitting diode ED2, and the third light-emitting diode ED3, respectively.

The conductive bank layer 300 may include outgassing holes OGH located in the non-display area NDA. The insulating layer (e.g., the second organic insulating layer 190 of FIG. 3D) may be disposed below the conductive bank layer 300 and extend toward the non-display area NDA. The conductive bank layer 300 may include the outgassing holes OGH, and a gas in the insulating layer (e.g., the second organic insulating layer 190 of FIG. 3D) may be externally discharged through the outgassing holes OGH.

The conductive bank layer 300 may include a first protruding portion 310EP and a second protruding portion 330EP. Each of the first and second protruding portions 310EP and 330EP may extend toward a side of the non-display area NDA. As illustrated in FIG. 4B, the first conductive layer 310 may include the first protruding portion 310EP. As illustrated in FIG. 4D, the third conductive layer 330 may include the second protruding portion 330EP.

As illustrated in FIGS. 3A to 3C, the first to third conductive layers 310, 320, and 330 may respectively include the openings 310OP1, 320OP1, and 330OP1 corresponding to the first opening OP1 of the conductive bank layer 300. For example, the first conductive layer 310 may include the opening 310OP, the second conductive layer 320 may include the opening 320OP1, and the third conductive layer 330 may include the opening 330OP1. The openings 310OP1, 320OP1, and 330OP1 of the first to third conductive layers 310, 320, and 330 may overlap one another as described above.

The first to third conductive layers 310, 320, and 330 may respectively include the openings 310OP2, 320OP2, and 330OP2 corresponding to the second opening OP2 of the conductive bank layer 300. For example, the first conductive layer 310 may include the opening 310OP2, the second conductive layer 320 may include the opening 320OP2, and the third conductive layer 330 may include the opening 330OP2. The openings 310OP2, 320OP2, and 330OP2 of the first to third conductive layers 310, 320, and 330 may overlap one another as described above. The first to third conductive layers 310, 320, and 330 may respectively include the openings 310OP3, 320OP3, and 330OP3 corresponding to the third opening OP3 of the conductive bank layer 300. For example, the first conductive layer 310 may include the opening 310OP3, the second conductive layer 320 may include the opening 320OP3, and the third conductive layer 330 may include the opening 330OP3. The openings 310OP3, 320OP3, and 330OP3 of the first to third conductive layers 310, 320, and 330 may overlap one another.

Referring to FIGS. 4A to 4D, the first to third conductive layers 310, 320, and 330 may respectively include outgassing holes 310OGH, 320OGH, and 330OGH corresponding to the outgassing holes OGH of the conductive bank layer 300. The outgassing holes 310OGH. 320OGH, and 330OGH of the first to third conductive layers 310, 320, and 330 described above may overlap one another.

FIGS. 5A to 5K are schematic cross-sectional views of a process for manufacturing the display apparatus 1 according to another embodiment.

Figure 5A:
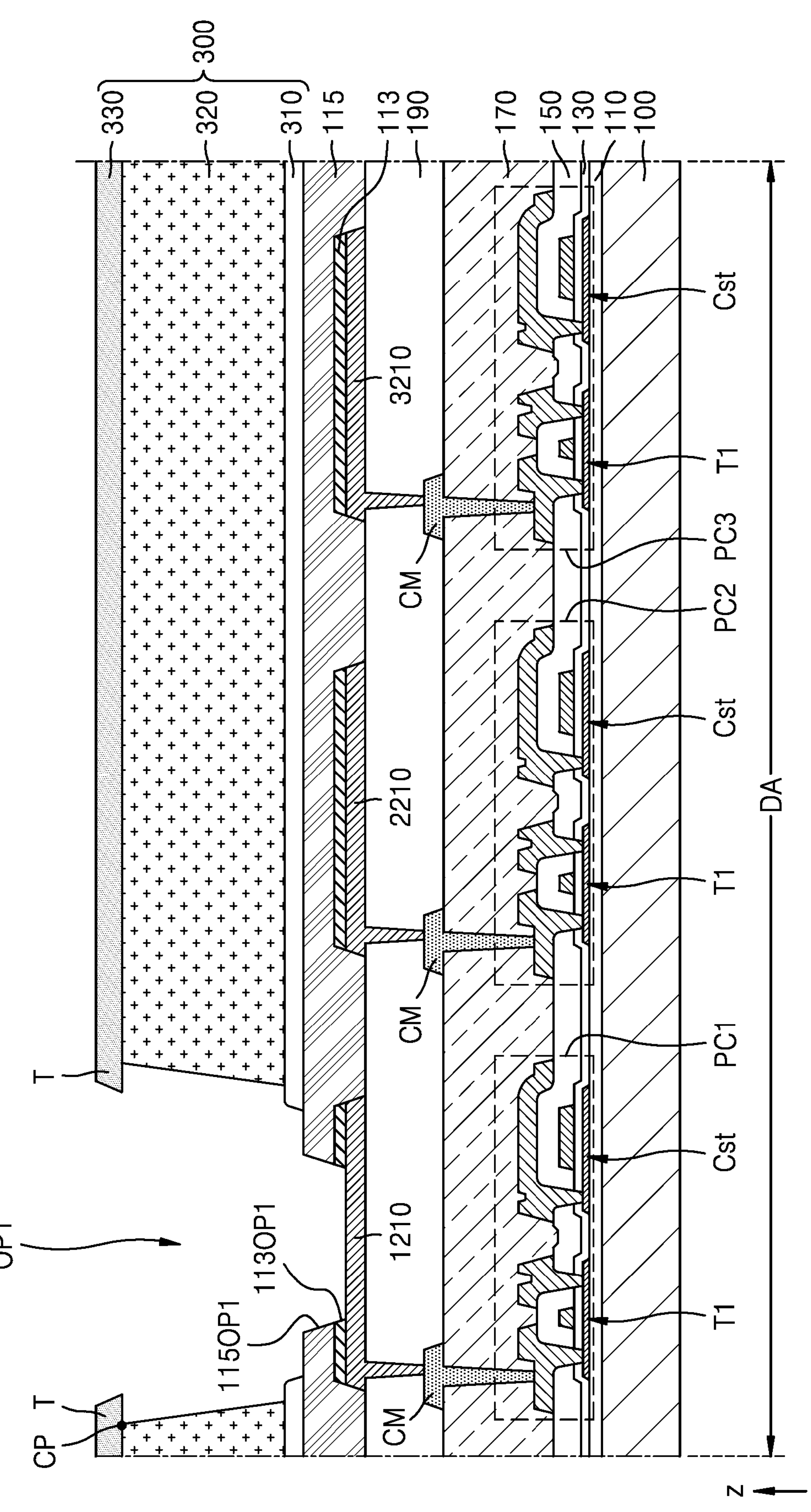
Figure 5B:
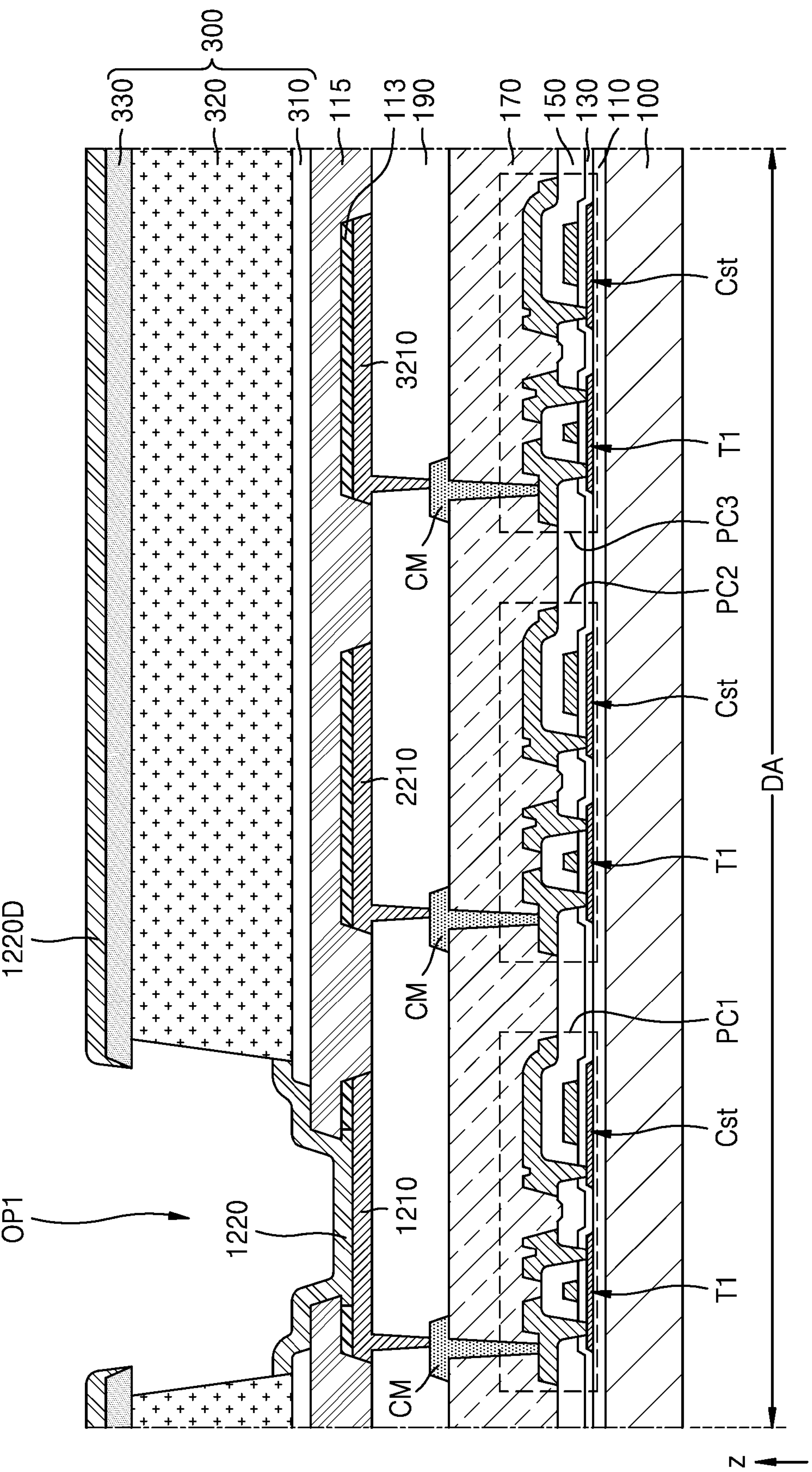

Referring to FIG. 5A, sub-pixel electrodes (e.g., the first sub-pixel electrode 1210, the second sub-pixel electrode 2210, and the third sub-pixel electrode 3210) may be formed on the substrate 100. In a process of forming the first sub-pixel electrode 1210, the second sub-pixel electrode 2210, and the third sub-pixel electrode 3210, the protection layer 113 may be formed on an upper surface of each of the first sub-pixel electrode 1210, the second sub-pixel electrode 2210, and the third sub-pixel electrode 3210.

The first sub-pixel circuit PC1, the second sub-pixel circuit PC2, and the third sub-pixel circuit PC3 may be formed on the substrate 100. The first sub-pixel electrode 1210, the second sub-pixel electrode 2210, and the third sub-pixel electrode 3210 may be formed on the substrate 100 on which the first sub-pixel circuit PC1, the second sub-pixel circuit PC2, and the third sub-pixel circuit PC3 are disposed. The first to third sub-pixel electrodes 1210, 2210, and 3210 and the first to third sub-pixel circuits PC1, PC2, and PC3 may have substantially the same structure as described with reference to FIG. 3A. Thus, detailed description of the same constituent elements is omitted.

The conductive bank layer 300 including the first to third conductive layers 310, 320, and 330 may be formed on the first to third sub-pixel electrodes 1210, 2210, and 3210. The insulating layer 115 may be formed on the first sub-pixel electrode 1210, the second sub-pixel electrode 2210, and the third sub-pixel electrode 3210. The conductive bank layer 300 may be formed on the insulating layer 115. For example, the insulating layer 115 may be formed in (e.g., be entirely formed in) the display area DA to be in direct contact with an upper surface of each of the protection layer 113 on the first sub-pixel electrode 1210, the protection layer 113 on the second sub-pixel electrode 2210, and the protection layer 113 on the third sub-pixel electrode 3210, and to be in contact with an upper surface of the second organic insulating layer 190.

The first opening OP1 may be formed in the conductive bank layer 300 and overlap the first sub-pixel electrode 1210 in a plan view. In the process of forming the first opening OP1, or after the process of forming the first opening OP1, an opening 115OP1 of the insulating layer 115 and an opening 113OP1 of the protection layer 113 may be formed. For example, the first opening OP1, the opening 115OP1 of the insulating layer 115, and the opening 113OP1 of the protection layer 113 may be formed through a same process.

In other embodiments, the opening 115OP1 of the insulating layer 115 and the opening 113OP1 of the protection layer 113 may be formed after the first opening OP1 is formed. The first opening OP1 of the conductive bank layer 300, the opening 115OP1 of the insulating layer 115, and the opening 113OP1 of the protection layer 113 may be formed by using dry and/or wet etching.

In the process of forming the first opening OP1, the conductive bank layer 300 may have an overhang structure. For example, the third conductive layer 330 of the conductive bank layer 300 may include the tip T protruding toward the first opening OP1 of the conductive bank layer 300. The tip T may be formed as a portion of the third conductive layer 330 facing the first opening OP1. The tip T may protrude in a side direction toward the first opening OP1 from the point CP where the side surface of the second conductive layer 320 facing the first opening OP1 meets the bottom surface of the third conductive layer 330 (or the boundary between the side surface of the second conductive layer 320 facing the first opening OP1 and the bottom surface of the third conductive layer 330).

The first intermediate layer 1220 may be formed through (e.g., formed in) the first opening OP1 of the conductive bank layer 300. The material for forming the first intermediate layer 1220 may be deposited on the first sub-pixel electrode 1210 through the first opening OP1. Thus, the first intermediate layer 1220 may be formed in the first opening OP1. The material for forming the first intermediate layer 1220 may be deposited on the upper surface of the conductive bank layer 300 (e.g., the upper surface of the third conductive layer 330), and a first dummy intermediate layer 1220D may be formed of the third conductive layer 330. Due to the overhang structure of the conductive bank layer 300 having the tip T, the first intermediate layer 1220 may be separated from the first dummy intermediate layer 1220D.

The temperature of the conductive bank layer 300 may be increased. For example, a current may flow through the conductive bank layer 300 and heat (e.g., joule heating) may be generated in the conductive bank layer 300. Thus, the temperature of the conductive bank layer 300 may be increased. For example, a current may be applied to (e.g., directly applied to) the conductive bank layer 300. In other embodiments, a current may flow by using an induced electromotive force and the temperature of the conductive bank layer 300 may be increased.

Figure 5C:
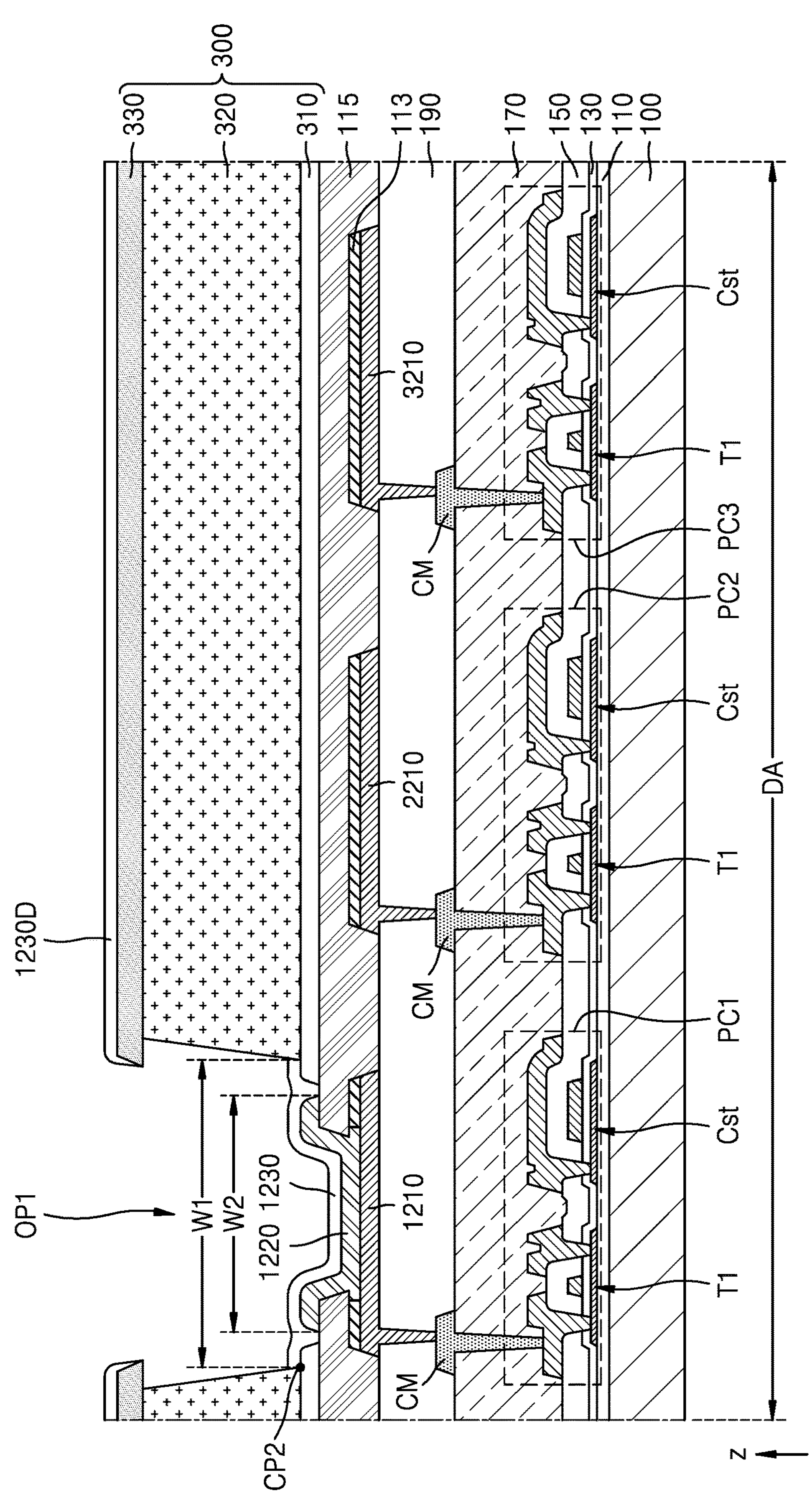

Due to the increase in the temperature of the conductive bank layer 300, the portion of the first intermediate layer 1220 contacting and/or overlapping the conductive bank layer 300 and the whole of the first dummy intermediate layer 1220D may be vaporized and removed. Accordingly, as illustrated in FIG. 5C, the first intermediate layer 1220 may not exist on the upper surface of the first conductive layer 310 of the conductive bank layer 300. In some embodiments, the edge of the first intermediate layer 1220 may be separated from the edge of the first conductive layer 310 with a gap therebetween. The first dummy intermediate layer 1220D may not exist on the conductive bank layer 300. In FIG. 5C, the edge of the first intermediate layer 1220 may be separated from the edge of the first conductive layer 310 corresponding to the first opening OP1.

The first counter electrode 1230 may be formed on the first intermediate layer 1220. The first counter electrode 1230 may overlap in a plan view and may be in direct contact with the first intermediate layer 1220 through the first opening OP1 of the conductive bank layer 300. The first counter electrode 1230 may be formed by a deposition method, and a material forming the first counter electrode 1230 may be deposited in a direction perpendicular and oblique to the substrate 100. The first counter electrode 1230 may be in direct contact with the conductive bank layer 300 by passing over the edge of the first intermediate layer 1220. A first dummy counter electrode 1230D may be formed on the upper surface of the conductive bank layer 300 (e.g., the upper surface of the third conductive layer 330). The width W1 of the first counter electrode 1230 may be greater than the width W2 of the first intermediate layer 1220. The first counter electrode 1230 may be in direct contact with the conductive bank layer 300. For example, a portion of the upper surface of the first conductive layer 310, from the second point CP2 where the upper surface of the first conductive layer 310 meets the side surface of the second conductive layer 320 to the edge of the first conductive layer 310, may be in contact with (e.g., be entirely in contact with) the first counter electrode 1230. The lower portion of the side surface of the second conductive layer 320 may also be in contact with the first counter electrode 1230. The first dummy counter electrode 1230D may be in direct contact with the upper surface of the conductive bank layer 300 (e.g., the upper surface of the third conductive layer 330). The first sub-pixel electrode 1210, the first intermediate layer 1220, and the first counter electrode 1230 may form the first light-emitting diode ED1 emitting the first color light.

Accordingly, the first counter electrode 1230 may be disposed over the edge of the first intermediate layer 1220 and be coplanar with the conductive bank layer 300. The first counter electrode 1230 may have a greater width than the first intermediate layer 1220. The first counter electrode 1230 may be in direct contact with the conductive bank layer 300. In FIG. 5C, edge portions of the first counter electrode 1230 may be in direct contact with a portion (e.g., an exposed portion) of the upper surface of the first conductive layer 310 and a portion (e.g., a lower portion) of the side surface of the second conductive layer 320. For example, the exposed portion of the upper surface of the first conductive layer 310, an exposed portion of the insulating layer 115, the upper surface of the first intermediate layer 1220, the lower portion of the side surface of the second conductive layer 320 may be in contact with the first counter electrode 1230.

As illustrated in FIG. 5D, after a first inorganic barrier layer 1510 is formed, a first photoresist PR1 may be formed in and correspond to or overlap the first opening OP1. The first inorganic barrier layer 1510 may include at least one inorganic material, e.g., of an aluminum oxide, a titanium oxide, a tantalum oxide, a hafnium oxide, a zinc oxide, a silicon oxide, a silicon nitride, a silicon oxynitride, and the like. The first inorganic barrier layer 1510 may be formed by a chemical vapor deposition method. The first inorganic barrier layer 1510 may have a relatively excellent step coverage. The first inorganic barrier layer 1510 may not be electrically disconnected or separated from each other (or may extend on the display apparatus 1) by the overhang structure. For example, the first inorganic barrier layer 1510 may be continuously formed. In an embodiment, the first inorganic barrier layer 1510 may be continuously formed on and overlap or cover an upper surface and a side surface of the first dummy counter electrode 1230D, a side surface and a bottom surface of the third conductive layer 330, the side surface of the second conductive layer 320, and an upper surface of the first counter electrode 1230.

Figure 5E:
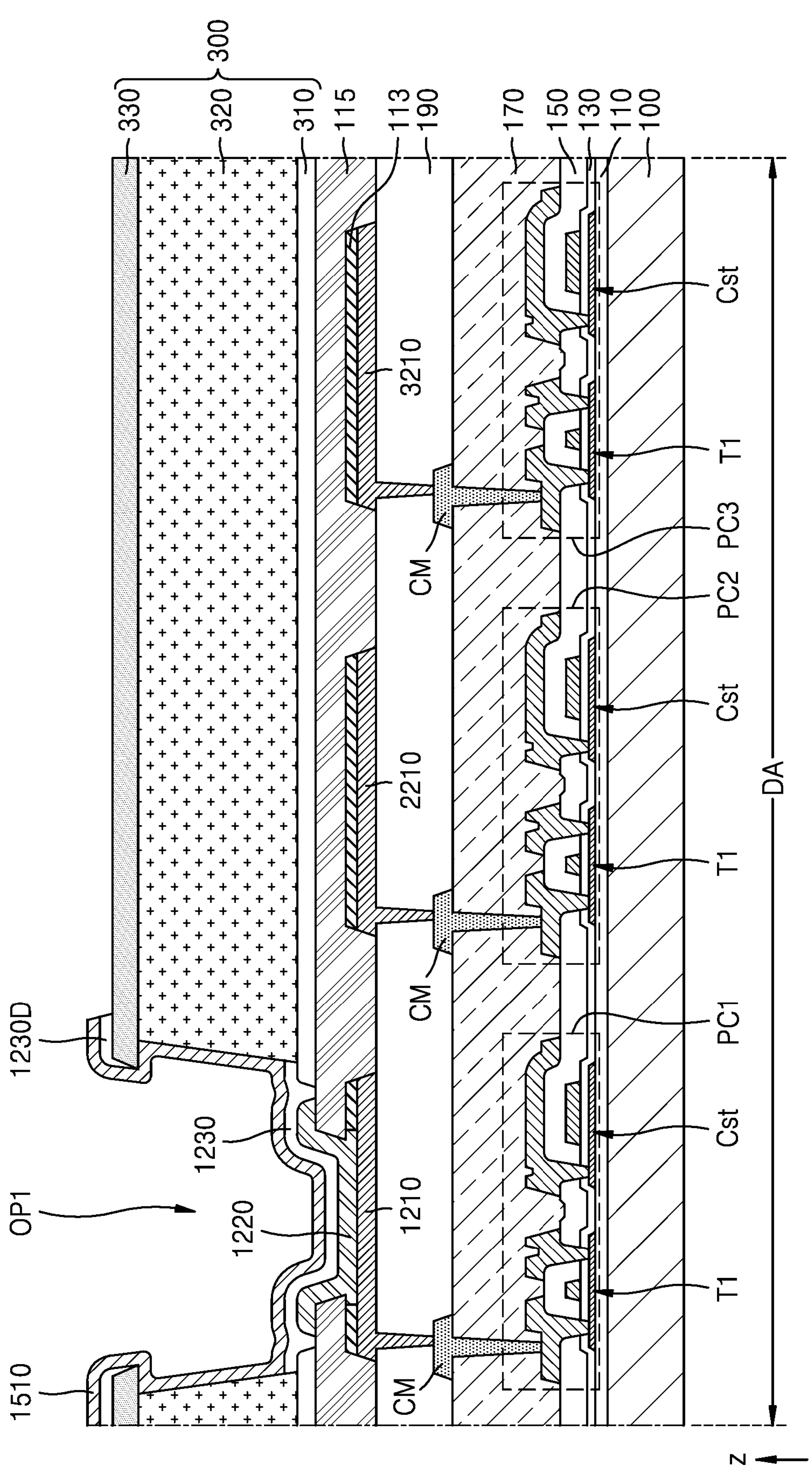

In case that a portion of the first inorganic barrier layer 1510 and a portion of the first dummy counter electrode 1230D, which do not overlap the first photoresist PR1, are removed by using the first photoresist PR1 as a mask, the first inorganic barrier layer 1510 and the first dummy counter electrode 1230D may partially remain (e.g., remain on the third conductive layer 330), as illustrated in FIG. 5E. The first sub-pixel electrode 1210, the first intermediate layer 1220, and the first counter electrode 1230 may each have an island shape in a plan view. For example, the first inorganic barrier layer 1510 (e.g., a portion of the first inorganic barrier layer 1510 disposed on the first dummy counter electrode 1230D) and the first dummy counter electrode 1230D may each have an isolated shape.

Figure 5F:
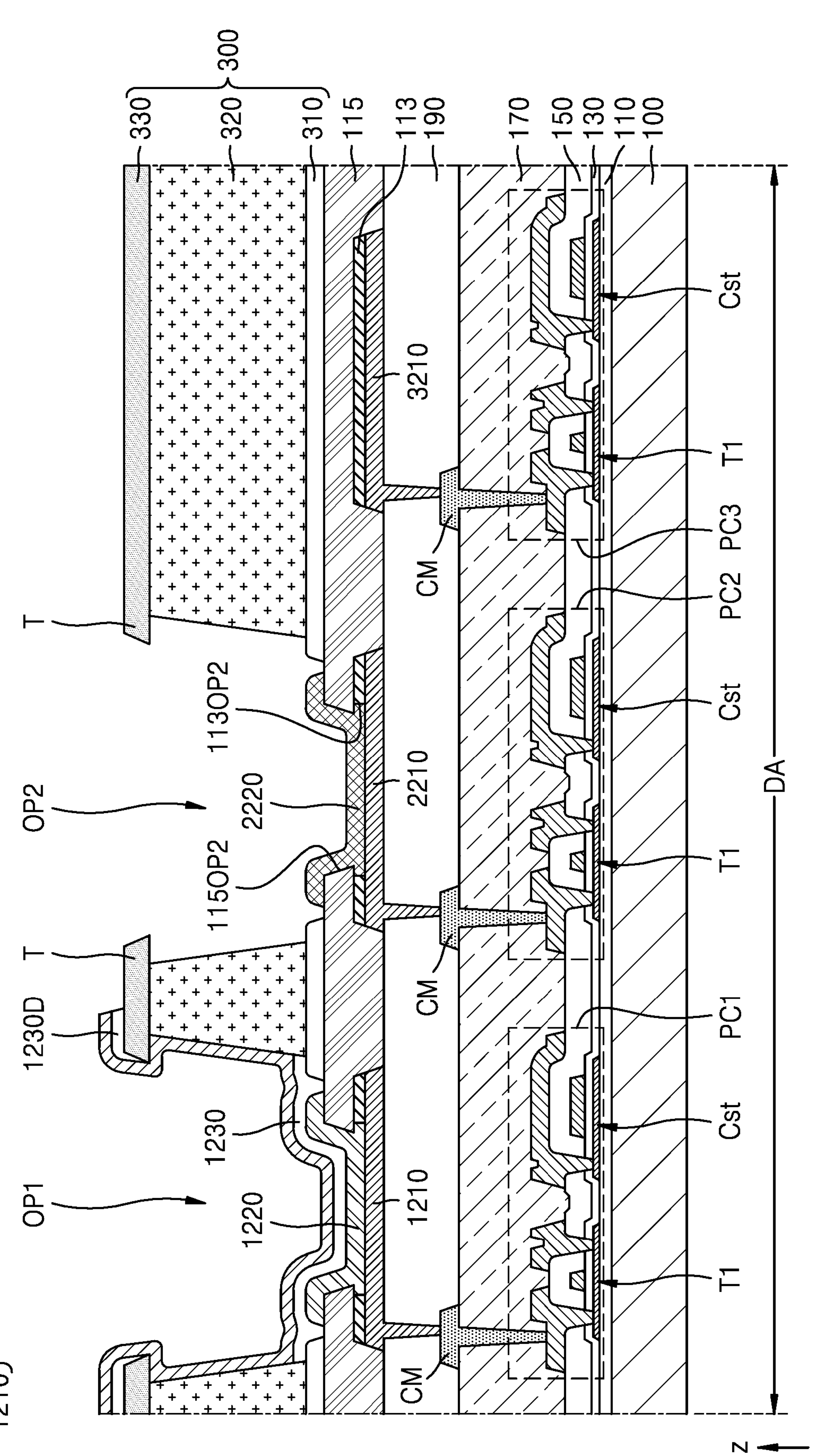

Referring to FIG. 5F, the second opening OP2 of the conductive bank layer 300 overlapping the second sub-pixel electrode 2210 may be formed through the conductive bank layer 300. In the process of forming the second opening OP2, or after the process of forming the second opening OP2, an opening 115OP2 of the insulating layer 115 and an opening 113OP2 of the protection layer 113 may be formed. For example, the second opening OP2, the opening 115OP2 of the insulating layer 115, and the opening 113OP2 of the protection layer 113 may be formed through a same process. In other embodiments, the opening 115OP2 of the insulating layer 115 and the opening 113OP2 of the protection layer 113 may be formed after the second opening OP2 is formed. The second opening OP2 of the conductive bank layer 300, the opening 115OP2 of the insulating layer 115, and the opening 113OP2 of the protection layer 113 may be formed by using dry and/or wet etching.

In the process of forming the second opening OP2, the conductive bank layer 300 may have an overhang structure. For example, the third conductive layer 330 of the conductive bank layer 300 may include the tip T protruding toward the second opening OP2 of the conductive bank layer 300.

The second intermediate layer 2220 may be formed through (or formed in) the second opening OP2 of the conductive bank layer 300. In the process of forming the second intermediate layer 2220, the second intermediate layer 2220 may be in contact with the conductive bank layer 300 and a second dummy intermediate layer (not illustrated) may be formed on the conductive bank layer 300. The second dummy intermediate layer and the second intermediate layer 2220 may include a same material. The temperature of the conductive bank layer 300 may be increased. Thus, a portion of the second intermediate layer 2220 contacting the conductive bank layer 300, and the second dummy intermediate layer may be removed. The second intermediate layer 2220 may be spaced apart from the conductive bank layer 300 with a gap therebetween, and the second dummy intermediate layer may not exist on the conductive bank layer 300.

Figure 5G:
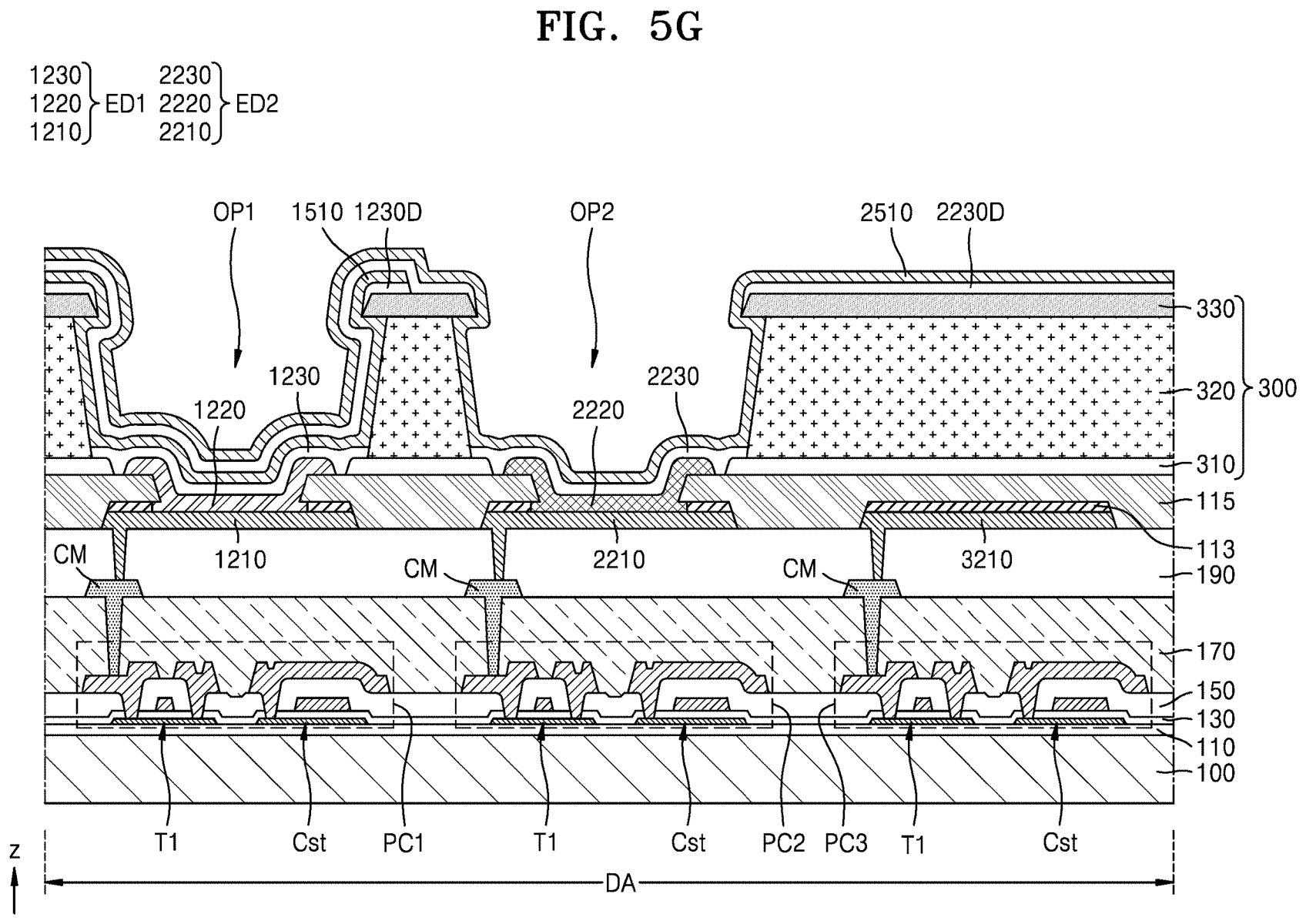

As illustrated in FIG. 5G, the second counter electrode 2230 may be formed in the second opening OP2. The second counter electrode 2230 may overlap in a plan view and may be in direct contact with the second intermediate layer 2220 through the second opening OP2 of the conductive bank layer 300. The second counter electrode 2230 may be formed by a deposition method, and the material forming the second counter electrode 2230 may be deposited in a direction perpendicular and oblique to the substrate 100. A second dummy counter electrode 2230D may be formed on an upper surface of the third conductive layer 330. The second counter electrode 2230 may pass over the edge of the second intermediate layer 2220 and be in direct contact with the conductive bank layer 300. For example, the second dummy counter electrode 2230D may be formed on the upper surface of the conductive bank layer 300 (e.g., the upper surface of the third conductive layer 330). The width of the second counter electrode 2230 may be greater than the width of the second intermediate layer 2220, and the second counter electrode 2230 may be in direct contact with the conductive bank layer 300. The second dummy counter electrode 2230D may be in direct contact with a portion of the upper surface of the conductive bank layer 300 (e.g., a portion of the upper surface of the third conductive layer 330) arranged around the second opening OP2. The second sub-pixel electrode 2210, the second intermediate layer 2220, and the second counter electrode 2230 may form the second light-emitting diode ED2 emitting the second color light.

A second inorganic barrier layer 2510 may be formed. The second inorganic barrier layer 2510 having a relatively excellent step coverage like the first inorganic barrier layer 1510 of FIG. 5D may be continuously formed. The second inorganic barrier layer 2510 may include at least one inorganic material, e.g., of an aluminum oxide, a titanium oxide, a tantalum oxide, a hafnium oxide, a zinc oxide, a silicon oxide, a silicon nitride, a silicon oxynitride, and the like. For example, the second inorganic barrier layer 2510 may be formed by a chemical vapor deposition method. The second inorganic barrier layer 2510 may be continuously formed on and overlap or cover an upper surface and a side surface of the second dummy counter electrode 2230D, a side surface and a bottom surface of the third conductive layer 330, the side surface of the second conductive layer 320, and an upper surface of the second counter electrode 2230.

Figure 5H:
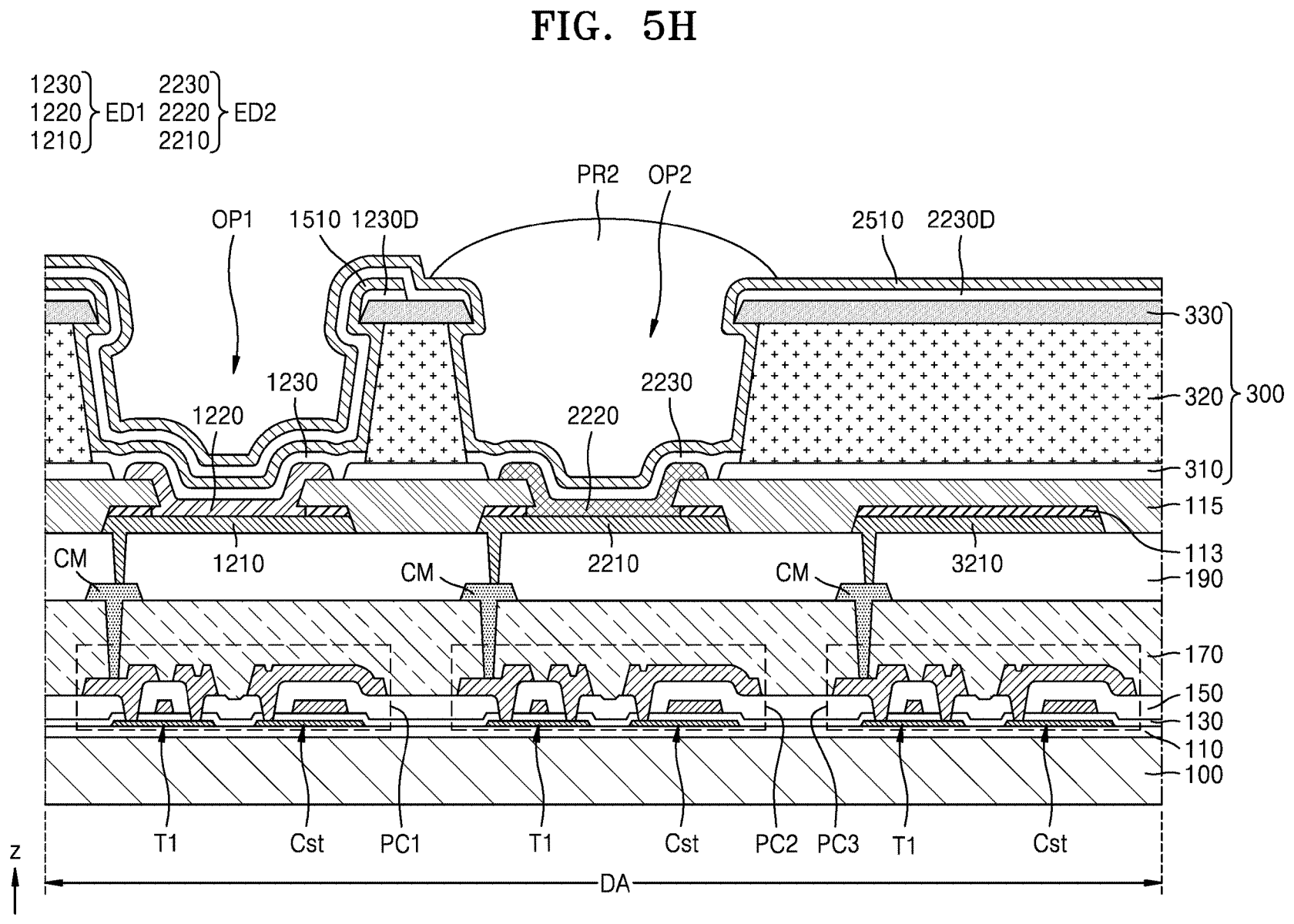
Figure 5I:
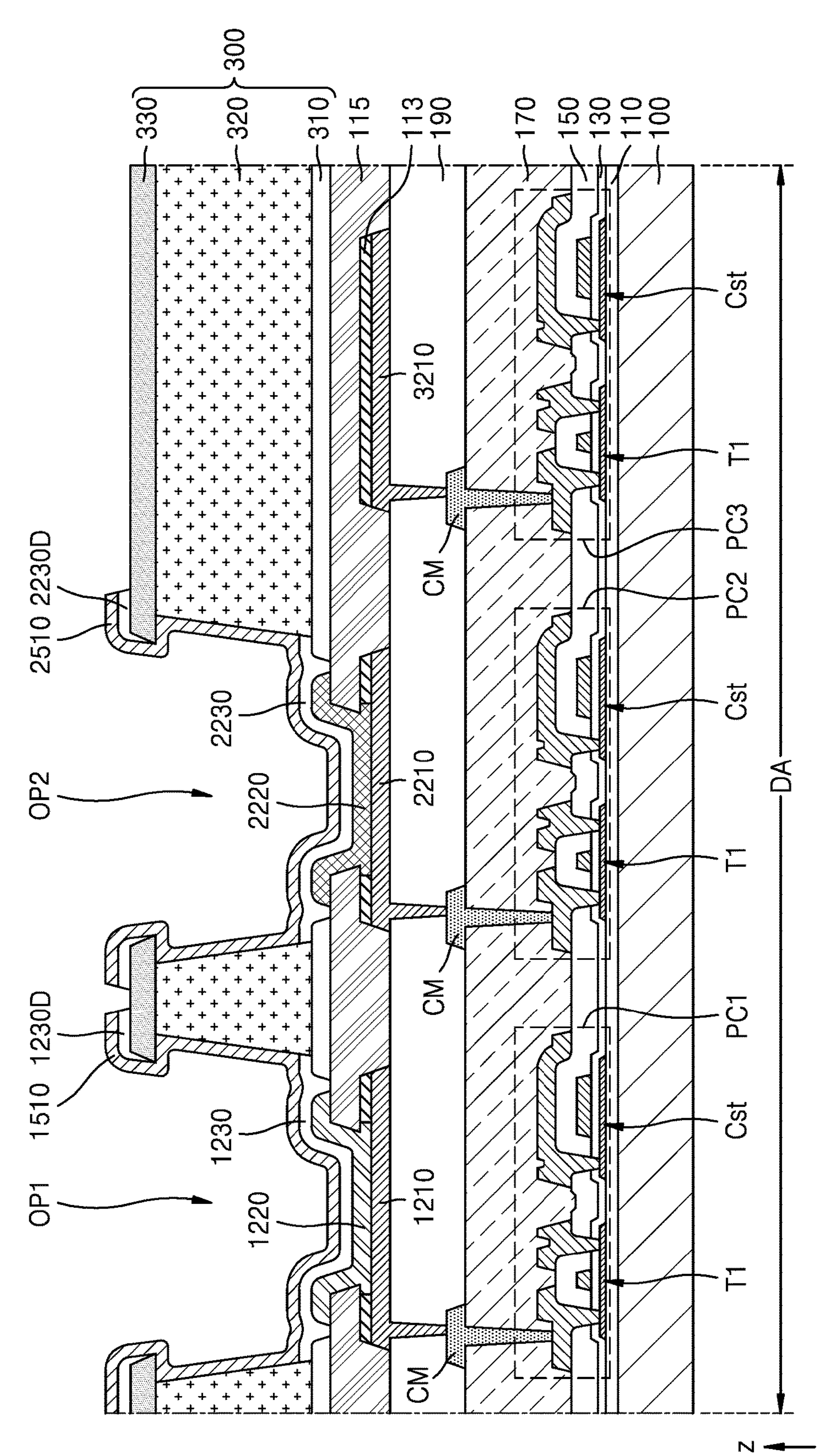

As illustrated in FIG. 5H, a second photoresist PR2 may be formed in and correspond to the second opening OP2. In case that a portion of the second inorganic barrier layer 2510 and a portion of the second dummy counter electrode 2230D, which do not overlap the second photoresist PR2, are removed by using the second photoresist PR2 as a mask, the second inorganic barrier layer 2510 and the second dummy counter electrode 2230D may partially remain (e.g., remain on the third conductive layer 330), as illustrated in FIG. 5I. The second sub-pixel electrode 2210, the second intermediate layer 2220, and the second counter electrode 2230 may each have the island shape. The second inorganic barrier layer 2510 and the second dummy counter electrode 2230D may each have an isolated shape.

Similar to the process of forming the first light-emitting diode ED1 and the first inorganic barrier layer 1510, and the process of forming the second light-emitting diode ED2 and the second inorganic barrier layer 2510, the third light-emitting diode ED3 and a third inorganic barrier layer 3510 may be formed on the third light-emitting diode ED3.

Figure 5J:
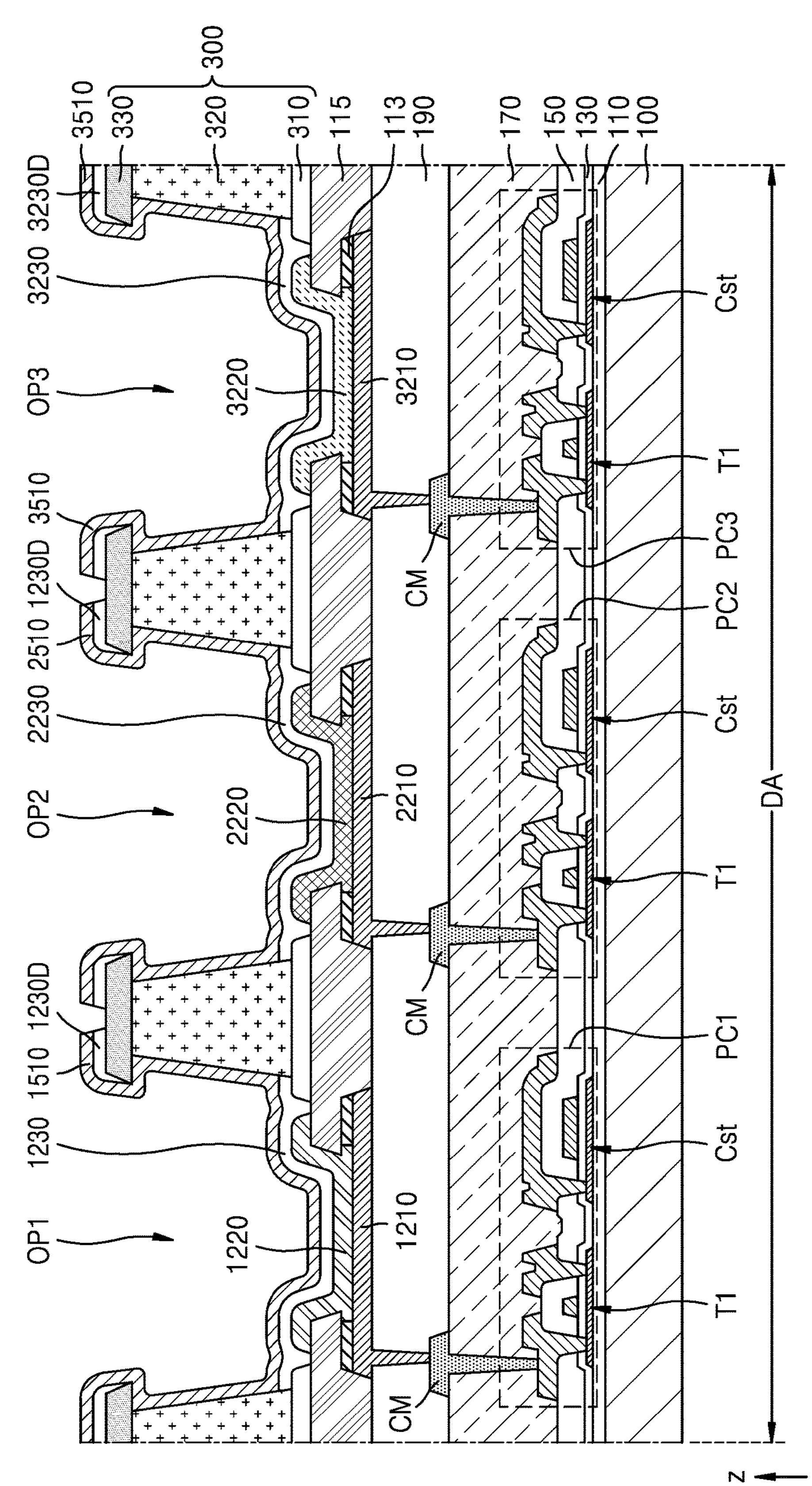

Referring to FIG. 5J, after the third opening OP3 of the conductive bank layer 300 is formed, the third intermediate layer 3220 may be formed in the third opening OP3. In the process of forming the third intermediate layer 3220 or thereafter, the temperature of the conductive bank layer 300 may be increased, and a material corresponding to the third intermediate layer 3220 may be prevented from contacting the conductive bank layer 300. The third counter electrode 3230 may be formed (e.g., may be formed on the third intermediate layer 3220). In the process of depositing the third counter electrode 3230, a third dummy counter electrode 3230D may be formed on the upper surface of the conductive bank layer 300. After the third inorganic barrier layer 3510 is formed, a portion of the third inorganic barrier layer 3510 and a portion of the third dummy counter electrode 3230D may be removed by using third photoresist formed in and overlapping the third opening OP3 as a mask. Referring to FIG. 5J, the third sub-pixel electrode 3210, the third intermediate layer 3220, and the third counter electrode 3230 may form the third light-emitting diode ED3 emitting the third color light, and the third inorganic barrier layer 3510 may be formed on the third light-emitting diode ED3.

Figure 5K:
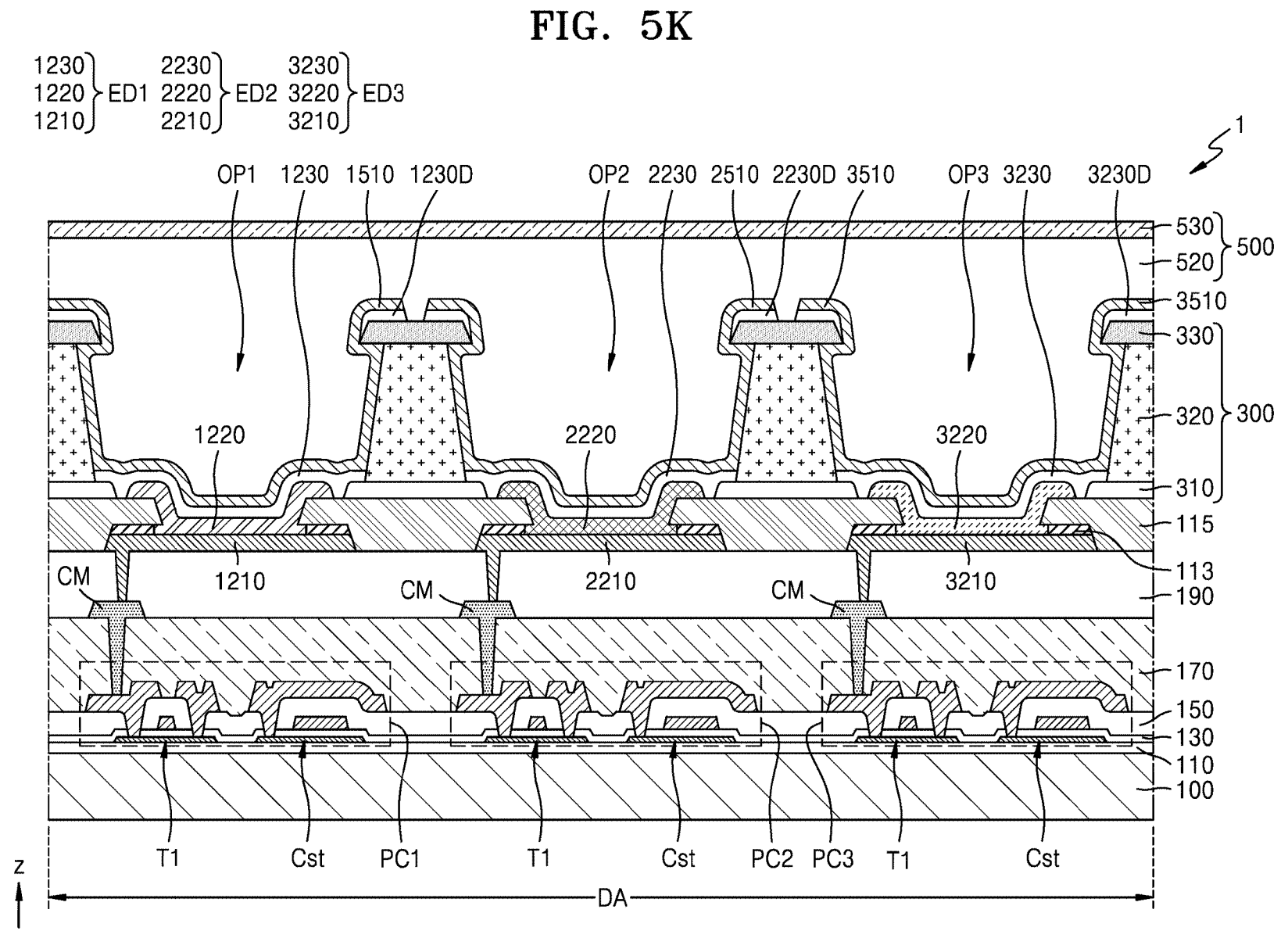

Referring to FIG. 5K, the encapsulation layer 500 may be formed (e.g., formed on the first to third inorganic barrier layers 1510, 2510, and 3510). For example, as illustrated in FIG. 5K, the organic encapsulation layer 520 and the second inorganic encapsulation layer 530 may be formed (e.g., formed on the first to third inorganic barrier layers 1510, 2510, and 3510). Referring to FIG. 5K, the organic encapsulation layer 520 may be in direct contact with the upper surfaces of the first to third inorganic barrier layers 1510, 2510, and 3510. In another embodiment, before the forming of the organic encapsulation layer 520, a first inorganic encapsulation layer may be additionally formed.

Figure 6:
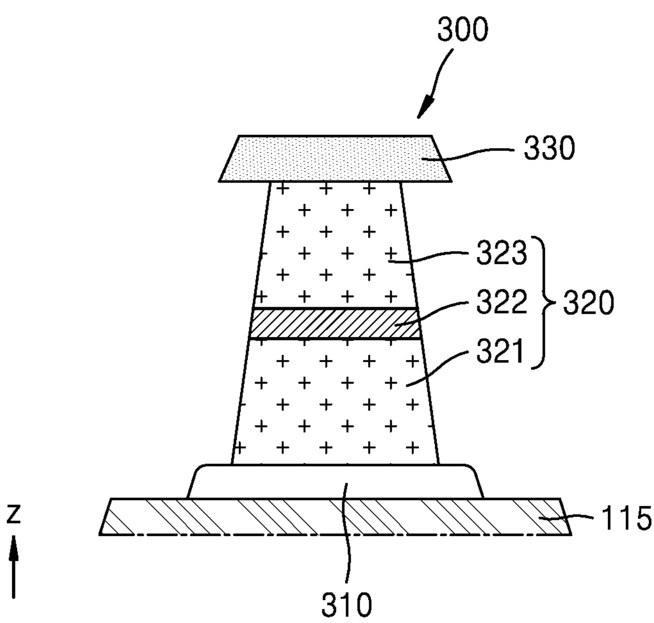
FIG. 6 is a schematic cross-sectional view of a conductive bank layer of a display apparatus according to another embodiment.

FIG. 6 is a schematic cross-sectional view of a conductive bank layer 300 of the display apparatus 1 according to another embodiment.

Referring to FIG. 6, the conductive bank layer 300 may be located on the insulating layer 115 and may include the first to third conductive layers 310, 320, and 330.

The first conductive layer 310 may include a metal such as titanium. The second conductive layer 320 may include sub-conductive layers including different materials. The second conductive layer 320 may have a stack structure of a sub-conductive layer including a metal and a sub-conductive layer including a conductive ceramic. For example, the second conductive layer 320 may include a first sub-conductive layer 321, a second sub-conductive layer 322, and a third sub-conductive layer 323. In some embodiments, the first sub-conductive layer 321 may include a metal, the second sub-conductive layer 322 may include a conductive ceramic, and the third sub-conductive layer 323 may include a metal. For example, the first and third sub-conductive layers 321 and 323 may each include a metal element, such as aluminum, magnesium, molybdenum, tungsten, nickel, a combination thereof, or the like. The second sub-conductive layer 322 may include conductive ceramic, such as a magnesium oxide, a titanium nitride, or the like. The third conductive layer 330 and the first conductive layer 310 may include a same material (e.g., a metal such as titanium). In another embodiment, the first and third conductive layers 310 and 330 may include different materials.

In FIG. 6, the second conductive layer 320 may include three sub-conductive layers. However, the disclosure is not limited thereto. In another embodiment, the second conductive layer 320 may have stack structures including two sub-sub-conductive layers (such as the first and second sub-conductive layers 321 and 322), or four or more sub-conductive layers.

According to an embodiment, a contact area between a counter electrode and a conductive bank layer may be increased, and the deterioration of display quality due to the resistance of the counter electrode may be prevented.

The above description is an example of technical features of the disclosure, and those skilled in the art to which the disclosure pertains will be able to make various modifications and variations. Thus, the embodiments of the disclosure described above may be implemented separately or in combination with each other.

The embodiments disclosed in the disclosure are intended not to limit the technical spirit of the disclosure but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display apparatus comprising:
a first sub-pixel electrode;
a conductive bank layer disposed on the first sub-pixel electrode and defining a first opening overlapping the first sub-pixel electrode in a plan view;
an insulating layer disposed between a peripheral portion of the first sub-pixel electrode and the conductive bank layer;
a first intermediate layer disposed on the first sub-pixel electrode in the first opening of the conductive bank layer; and
a first counter electrode disposed on the first intermediate layer in the first opening of the conductive bank layer, wherein
the conductive bank layer comprises:
a first conductive layer;
a second conductive layer disposed on the first conductive layer; and
a third conductive layer disposed on the second conductive layer, wherein the first opening penetrates the first conductive layer, the second conductive layer, and the third conductive layer,
the first counter electrode has a width greater than a width of the first intermediate layer, and
the first counter electrode is in direct contact with the conductive bank layer.

2. The display apparatus of claim 1, wherein an edge of the first intermediate layer is spaced apart from the first conductive layer of the conductive bank layer.

3. The display apparatus of claim 1, wherein the third conductive layer includes a tip protruding toward the first opening from a point where a side surface of the second conductive layer meets a bottom surface of the third conductive layer.

4. The display apparatus of claim 3, further comprising:
a dummy counter electrode separated from the first counter electrode by the tip,
wherein the first counter electrode and the dummy counter electrode include a same material.

5. The display apparatus of claim 4, wherein the dummy counter electrode is in direct contact with an upper surface of the conductive bank layer.

6. The display apparatus of claim 1, wherein the first counter electrode is in direct contact with a portion of an upper surface of the first conductive layer from a second point where the upper surface of the first conductive layer meets a side surface of the second conductive layer to an edge of the first conductive layer.

7. The display apparatus of claim 1, wherein the first conductive layer and the second conductive layer include different materials.

8. The display apparatus of claim 7, wherein the second conductive layer includes at least one of a metal and a conductive ceramic.

9. The display apparatus of claim 7, wherein the second conductive layer includes at least one of aluminum, magnesium, molybdenum, tungsten, nickel, magnesium oxide, and titanium nitride.

10. The display apparatus of claim 7, wherein the second conductive layer has a structure including a first sub-conductive layer including a metal and a second sub-conductive layer including a conductive ceramic.

11. A method of manufacturing a display apparatus, the method comprising:

forming a first sub-pixel electrode;

forming a conductive bank layer defining a first opening overlapping the first sub-pixel electrode in a plan view, the conductive bank layer disposed on the first sub-pixel electrode with an insulating layer between a peripheral portion of the first sub-pixel electrode and the conductive bank layer;

forming a first intermediate layer disposed on the first sub-pixel electrode in the first opening;

increasing a temperature of the conductive bank layer; and forming a first counter electrode disposed on the first intermediate layer in the first opening, wherein the conductive bank layer comprises:

a first conductive layer;

a second conductive layer disposed on the first conductive layer; and a third conductive layer disposed on the second conductive layer, wherein the first opening penetrates the first conductive layer, the second conductive layer, and the third conductive layer, the first counter electrode has a width greater than a width of the first intermediate layer, and the first counter electrode is in direct contact with the conductive bank layer.

12. The method of claim 11, wherein an edge of the first intermediate layer is spaced apart from the first conductive layer of the conductive bank layer.

13. The method of claim 11, wherein the forming of the conductive bank layer comprises forming the first opening such that the third conductive layer includes a tip protruding toward the first opening from a point where a side surface of the second conductive layer meets a bottom surface of the third conductive layer.

14. The method of claim 13, wherein the forming of the first counter electrode further comprises forming a dummy counter electrode disposed on the conductive bank layer, the dummy counter electrode is separated from the first counter electrode by the tip, and the first counter electrode and the dummy counter electrode include a same material.

15. The method of claim 14, wherein the dummy counter electrode is in direct contact with an upper surface of the conductive bank layer.

16. The method of claim 11, wherein the first counter electrode is in direct contact with a part of an upper surface of the first conductive layer from a second point where the upper surface of the first conductive layer meets a side surface of the second conductive layer to an edge of the first conductive layer.

17. The method of claim 11, wherein the insulating layer includes an inorganic insulating material.

18. The method of claim 11, wherein a material of the second conductive layer includes at least one of a metal and a conductive ceramic.

19. The method of claim 18, wherein the second conductive layer includes at least one of aluminum, magnesium, molybdenum, tungsten, nickel, a magnesium oxide, and a titanium nitride.

20. The method of claim 18, wherein the second conductive layer has a structure including a first sub-conductive layer including a metal; and a second sub-conductive layer including a conductive ceramic.

* * * * *